(12) United States Patent
Lee et al.

(10) Patent No.: US 12,431,437 B2
(45) Date of Patent: Sep. 30, 2025

(54) SEMICONDUCTOR DEVICE AND METHOD OF FORMING CONDUCTIVE STRUCTURE FOR EMI SHIELDING AND HEAT DISSIPATION

(71) Applicant: JCET STATS ChipPAC Korea Limited, Incheon (KR)

(72) Inventors: SeungHyun Lee, Incheon (KR); HeeSoo Lee, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 574 days.

(21) Appl. No.: 17/814,121

(22) Filed: Jul. 21, 2022

(65) Prior Publication Data
US 2024/0030154 A1    Jan. 25, 2024

(51) Int. Cl.
*H01L 23/552*    (2006.01)
*H01L 23/367*    (2006.01)
(Continued)

(52) U.S. Cl.
CPC ........ *H01L 23/552* (2013.01); *H01L 23/3675* (2013.01); *H01L 23/49816* (2013.01);
(Continued)

(58) Field of Classification Search
CPC ............... H01L 23/552; H01L 23/3675; H01L 23/49816; H01L 23/49833; H01L 23/5385; H01L 23/66; H01L 23/16; H01L 23/4334; H01L 23/562; H01L 23/3677; H01L 23/49838; H01L 23/5386; H01L 23/3672; H01L 23/5225; H01L 23/3121; H01L 23/5384; H01L 25/165; H01L 25/0657; H01L 25/16; H01L 25/0652; H01L 24/16; H01L 2223/6616; H01L 2223/6672; H01L 2223/6677; H01L 2224/16235;
(Continued)

(56) References Cited

U.S. PATENT DOCUMENTS

| 10,418,332 B2 | 9/2019 | Lee et al. |
| 10,566,298 B2 | 2/2020 | Dalmia et al. |

(Continued)

*Primary Examiner* — Marlon T Fletcher
*Assistant Examiner* — Christina A Sylvia
(74) *Attorney, Agent, or Firm* — Robert D. Atkins; PATENT LAW GROUP: Atkins and Associates, P.C.

(57) ABSTRACT

A semiconductor device has an antenna substrate and a component module disposed over the antenna substrate. The component module includes an electrical component, and a conductive structure formed around the electrical component. Alternatively, an electrical component can be disposed over the antenna substrate, and a conductive structure is disposed over the antenna substrate and around the electrical component. An encapsulant is deposited around the electrical component and conductive structure. A shielding material is formed over the component module, and a heat sink formed over the component module. The shielding material can be formed over the component module, while the heat sink is formed over the shielding material. Alternatively, the heat sink is formed over the component module, while the shielding material is formed over the heat sink. The conductive structure has a plurality of posts or a frame. A thermal interface material is disposed over the component module.

14 Claims, 24 Drawing Sheets

(51) Int. Cl.
*H01L 23/498* (2006.01)
*H01L 23/538* (2006.01)
*H01L 23/66* (2006.01)
*H01L 25/16* (2023.01)
*H01L 23/00* (2006.01)

(52) U.S. Cl.
CPC .... *H01L 23/49833* (2013.01); *H01L 23/5385* (2013.01); *H01L 23/66* (2013.01); *H01L 25/165* (2013.01); *H01L 23/3677* (2013.01); *H01L 23/49838* (2013.01); *H01L 23/5386* (2013.01); *H01L 24/16* (2013.01); *H01L 2223/6616* (2013.01); *H01L 2223/6672* (2013.01); *H01L 2223/6677* (2013.01); *H01L 2224/16235* (2013.01); *H01L 2924/16195* (2013.01); *H01L 2924/16196* (2013.01); *H01L 2924/16251* (2013.01); *H01L 2924/1632* (2013.01); *H01L 2924/182* (2013.01); *H01L 2924/2027* (2013.01); *H01L 2924/3025* (2013.01); *H01L 2924/3511* (2013.01)

(58) Field of Classification Search
CPC . H01L 2924/16195; H01L 2924/16196; H01L 2924/16251; H01L 2924/1632; H01L 2924/182; H01L 2924/2027; H01L 2924/3025; H01L 2924/3511; H01L 21/4882; H01L 21/50; H01Q 1/2283; H01Q 1/38
See application file for complete search history.

(56) References Cited

U.S. PATENT DOCUMENTS

| | | | |
|---|---|---|---|
| 10,629,542 B2* | 4/2020 | Hong | H05K 1/023 |
| 10,636,774 B2 | 4/2020 | Yang et al. | |
| 2015/0348936 A1* | 12/2015 | Lin | H01L 24/19 |
| | | | 257/659 |
| 2019/0051989 A1 | 2/2019 | Kim et al. | |
| 2021/0028122 A1* | 1/2021 | Son | H01L 23/15 |
| 2021/0091017 A1* | 3/2021 | Yeon | H01L 24/16 |
| 2021/0366838 A1 | 11/2021 | Han et al. | |
| 2021/0407927 A1 | 12/2021 | Salmon et al. | |
| 2022/0148983 A1* | 5/2022 | Lee | H01L 25/16 |
| 2024/0021536 A1* | 1/2024 | Kim | H01L 25/16 |

* cited by examiner

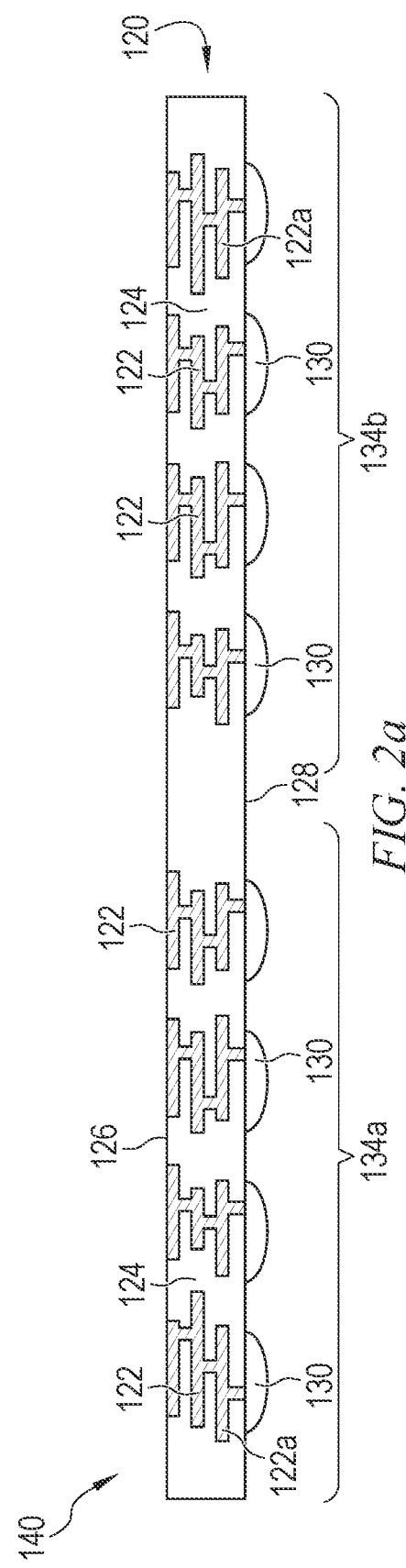
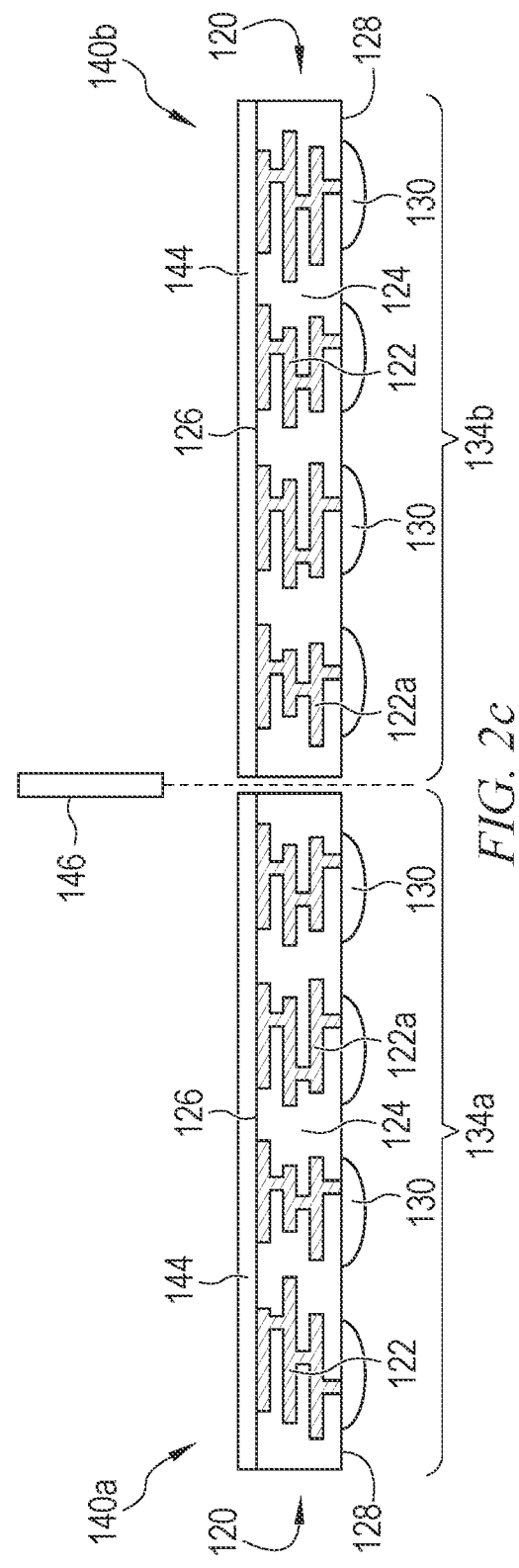

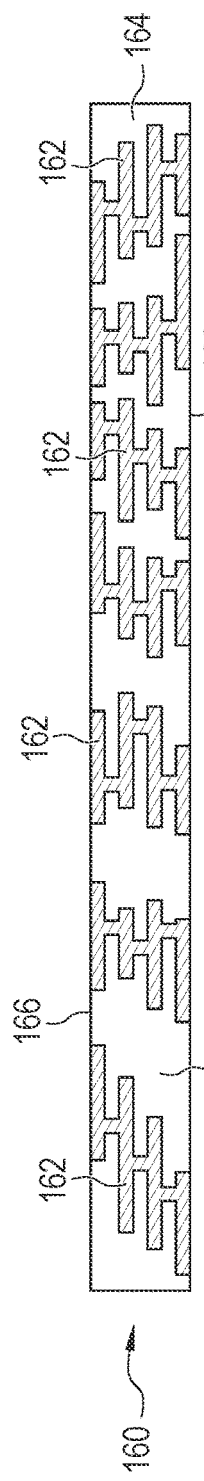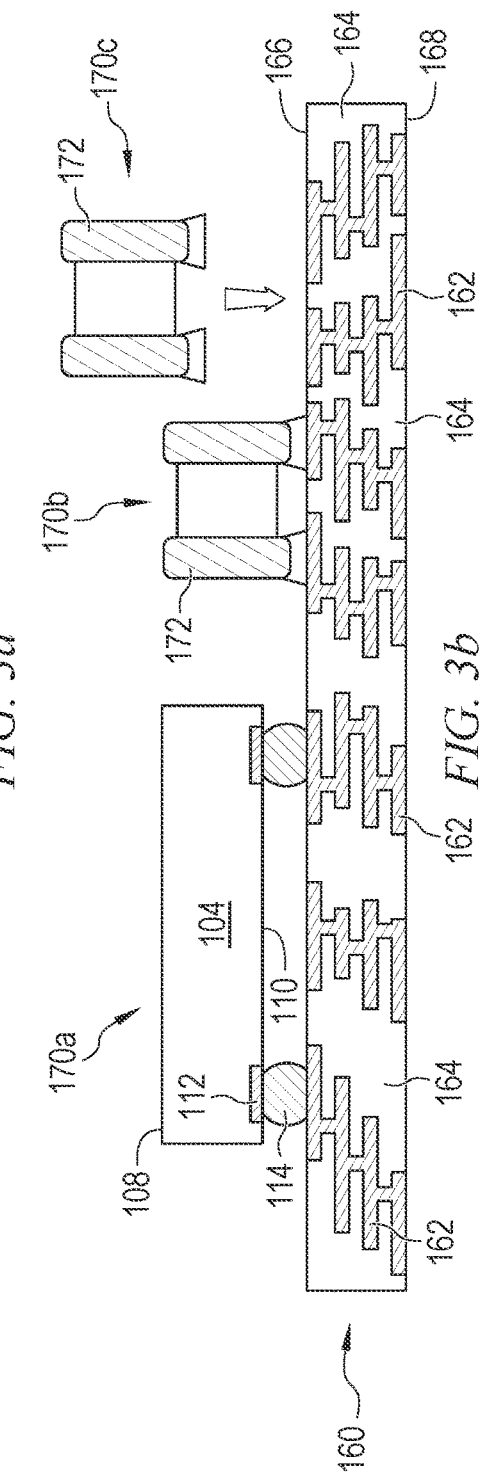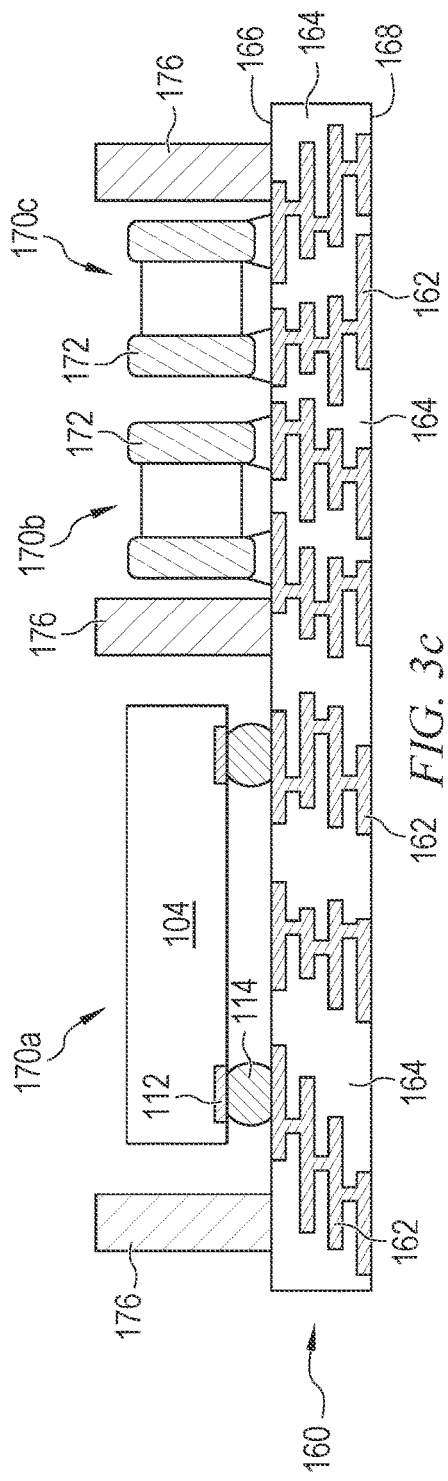

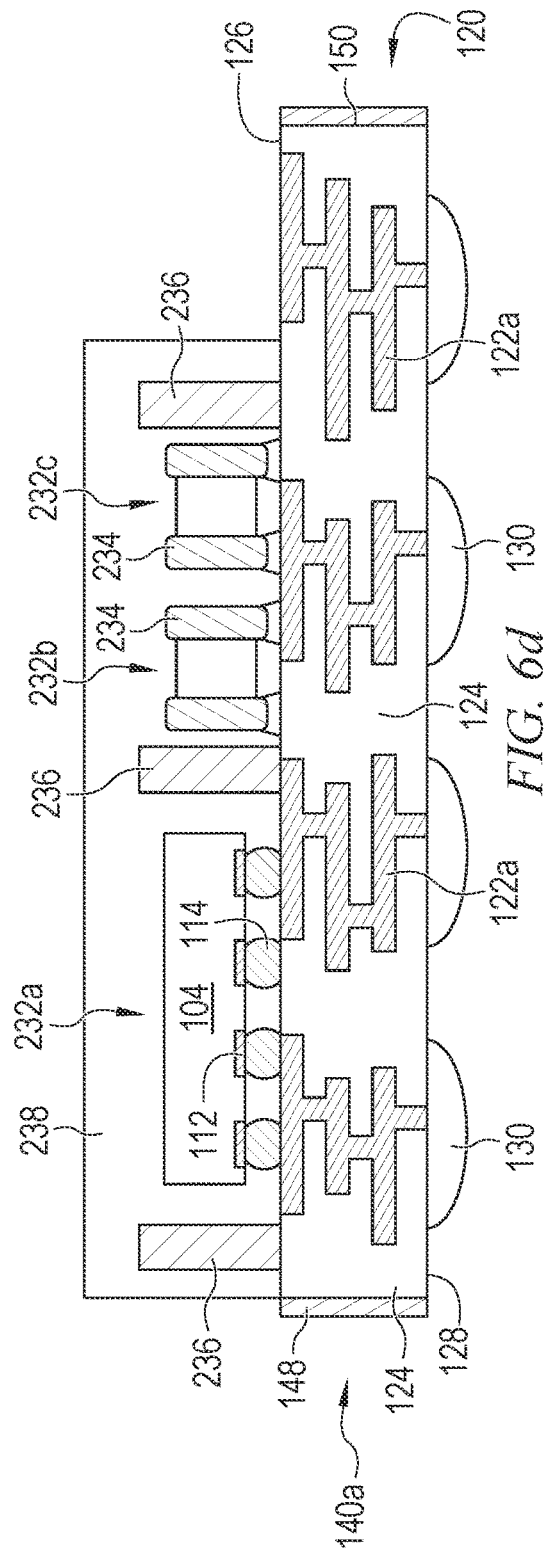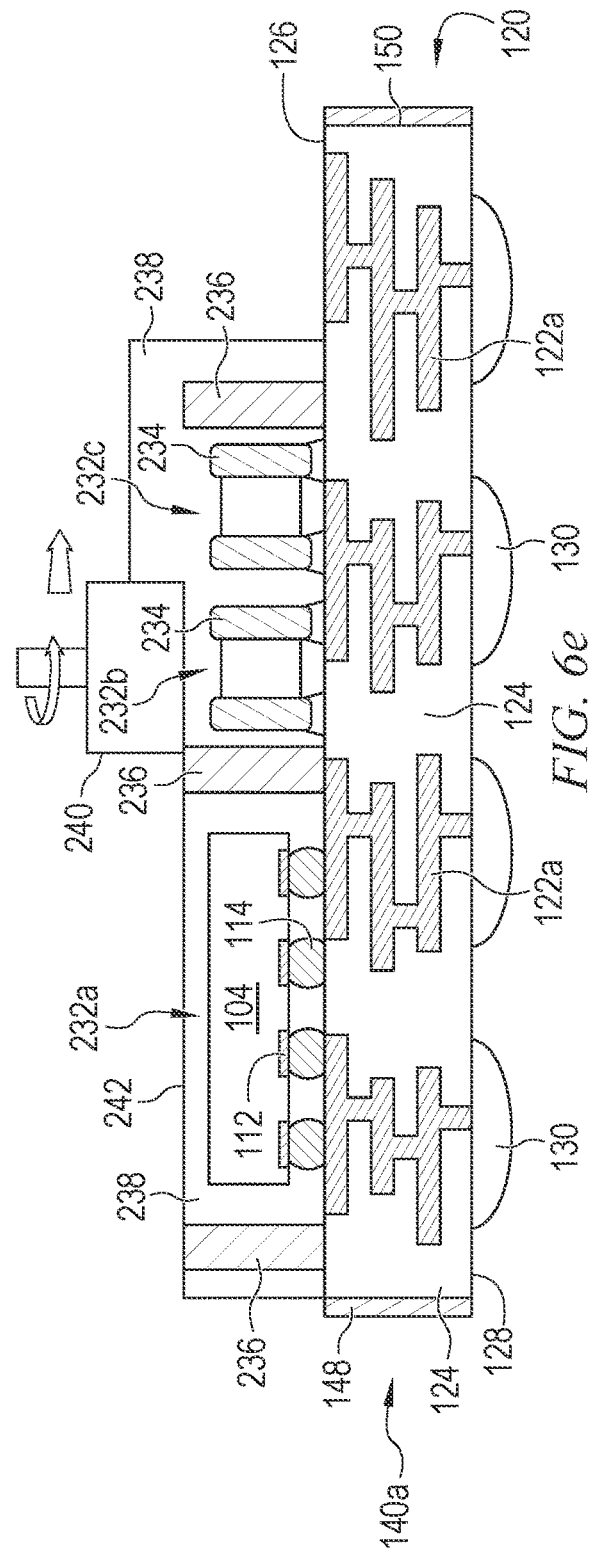

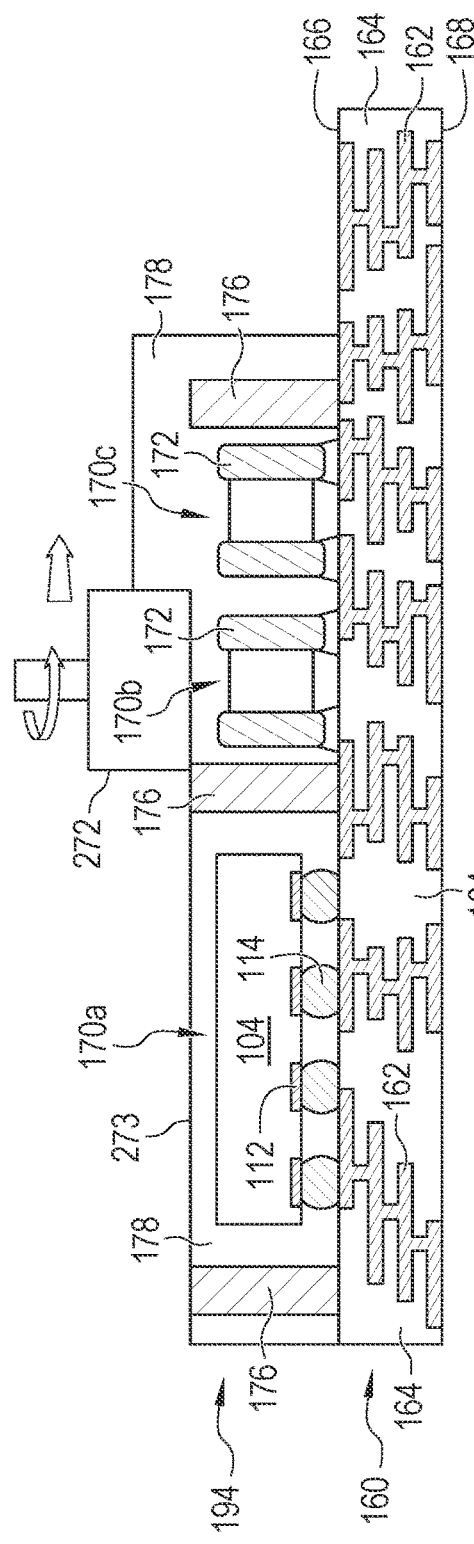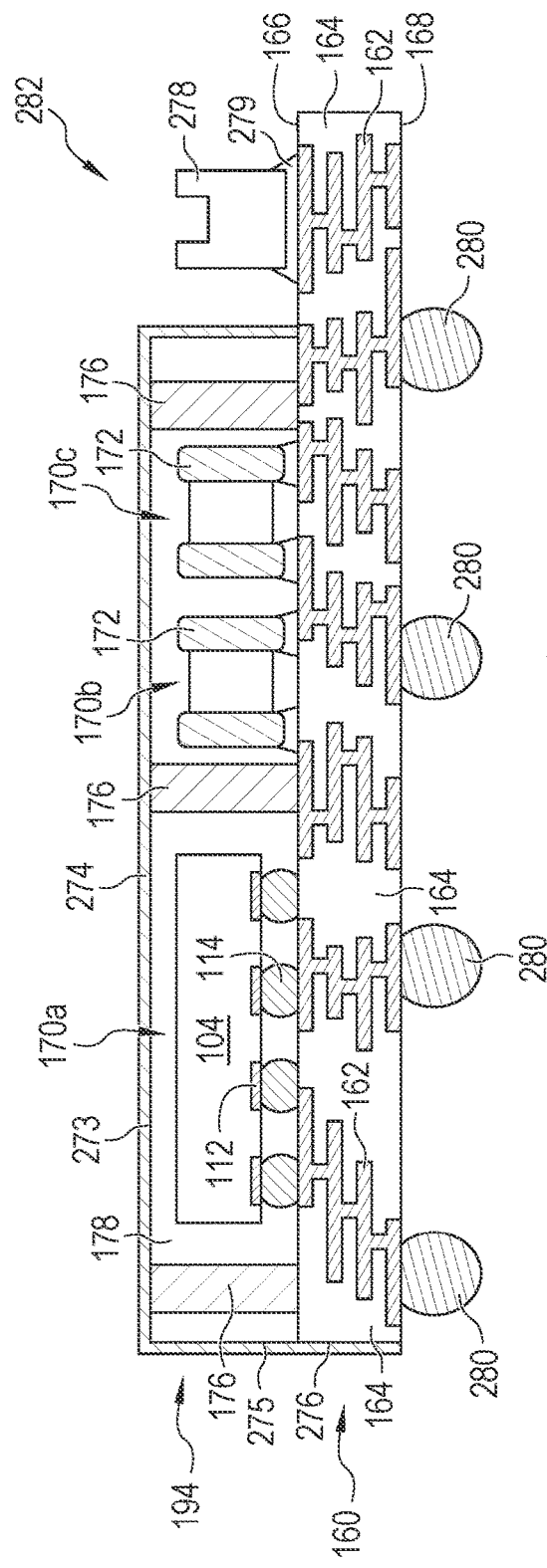

SEMICONDUCTOR DEVICE AND METHOD OF FORMING CONDUCTIVE STRUCTURE FOR EMI SHIELDING AND HEAT DISSIPATION

FIELD OF THE INVENTION

The present invention relates in general to semiconductor devices and, more particularly, to a semiconductor device and method of forming a conductive structure for electromagnetic interference (EMI) shielding and heat dissipation.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are disposed on a substrate for structural support and electrical interconnect. An encapsulant is deposited over the semiconductor die, IPDs, and substrate. An electrical connector is disposed on the substrate for electrical communication between the electrical components and external devices. The SiP module is partially molded in that the encapsulant does not extend to the electrical connector. The electrical connector is free standing on the substrate.

The SiP module includes high speed digital and RF electrical components, highly integrated for small size and low height, and operating at high clock frequencies. An electromagnetic shielding material is commonly conformally applied over the encapsulant. The electromagnetic shielding material reduces or inhibits EMI, RFI, and other inter-device interference, for example as radiated by high-speed digital devices, from affecting neighboring devices within or adjacent to SiP module.

The SiP module may also require access to wireless communications, i.e., an antenna, in a telecommunication application. The combination of an SiP module and antenna will require reduced interface pitches, higher interface pin-counts, reduced thickness, and higher level package technology, all contributing to heat during operation.

BRIEF DESCRIPTION OF THE DRAWINGS

FIGS. 2a-2f illustrate a process of forming an RF antenna substrate;

FIGS. 3a-3j illustrate a process of forming an SiP module with shielding;

FIGS. 6a-6g illustrate integration of the RF antenna and electrical components with shielding and heat sink;

FIGS. 8a-8d illustrate integration of the RF antenna and another SiP module with shielding and heat sink.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
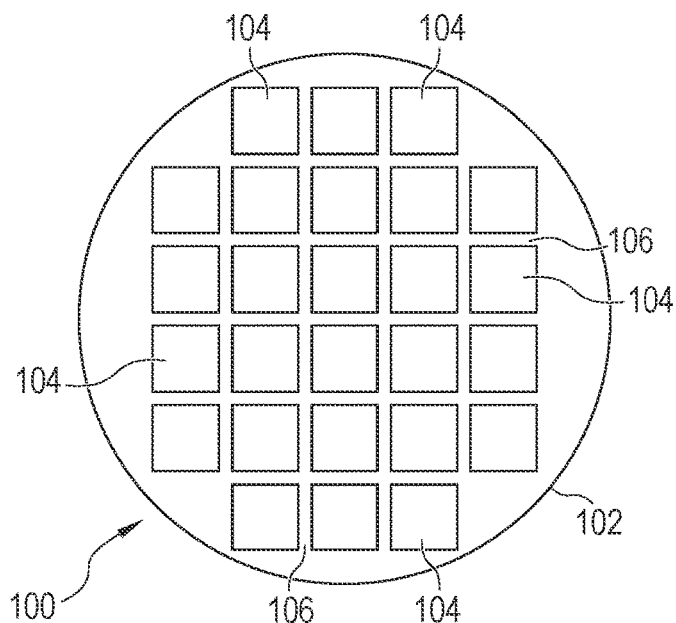
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
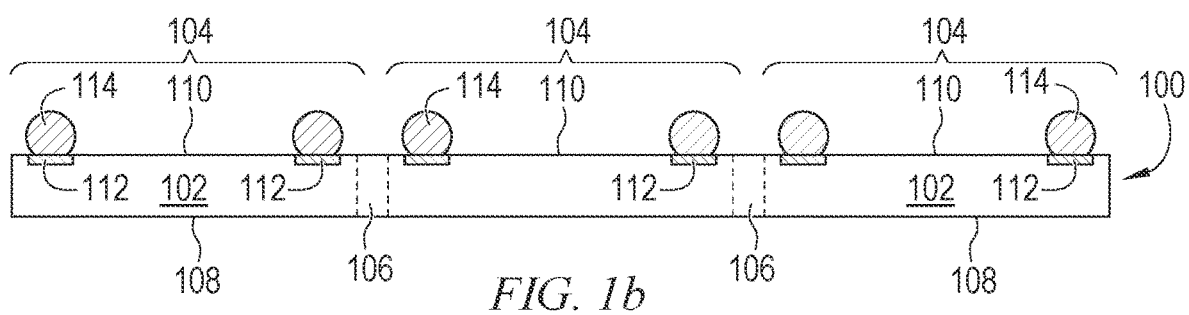

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
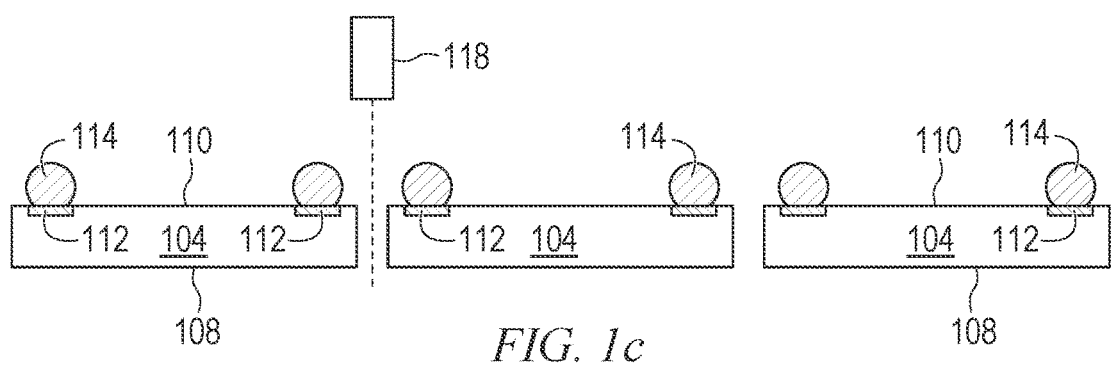

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2B:
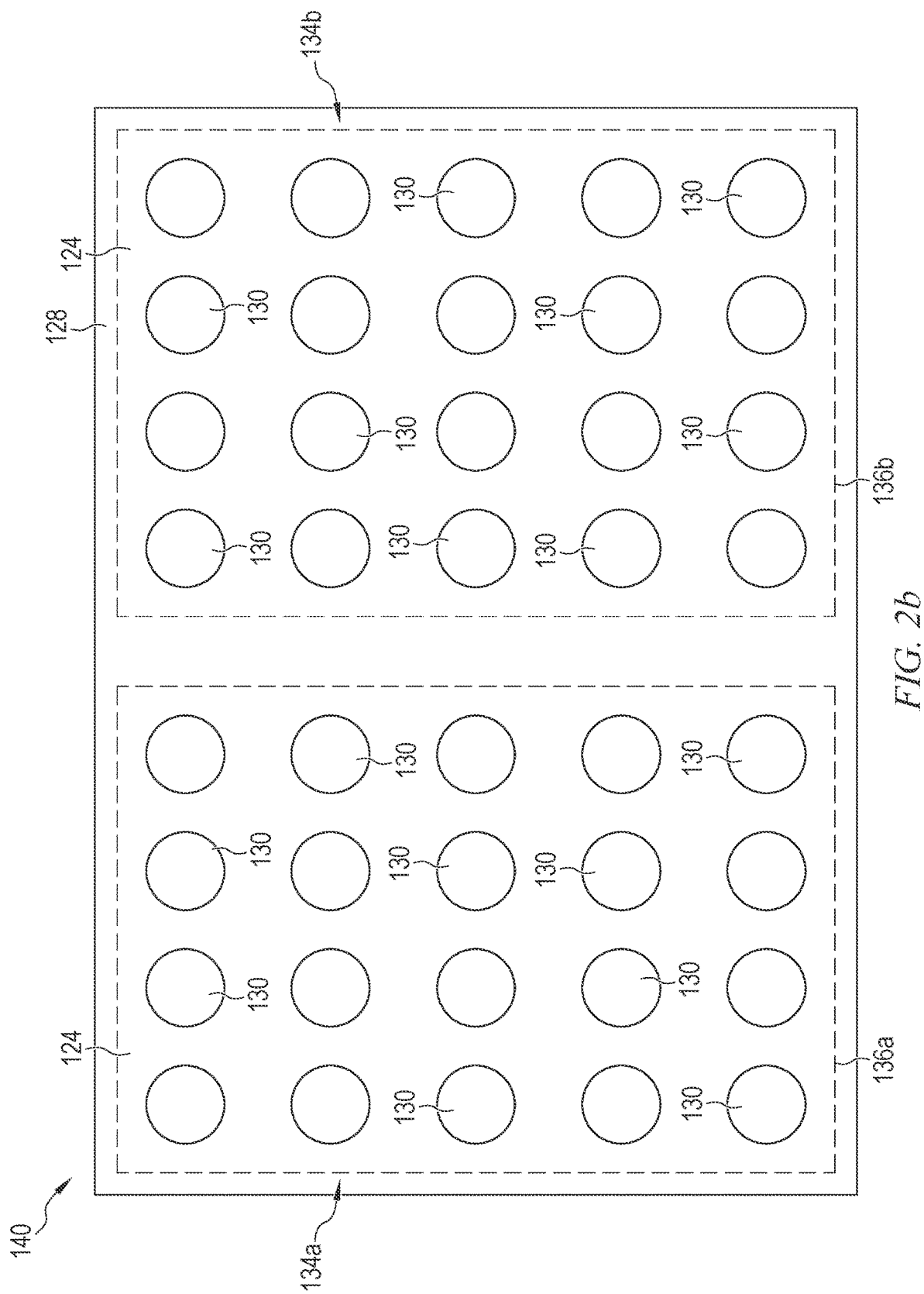

FIGS. 2a-2f illustrate a process of forming an RF antenna substrate. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122.

A portion of conductive layer 122 within substrate 120, such as conductive layer 122a, can operate as multiple RF antenna 134a and 134b of RF antenna interposer substrate 140. Insulating bumps 130 are formed over surface 128 of substrate 120 proximate to the embedded antenna. Insulating bumps 130 contain one or more layers of SiO2, Si3N4, SiON, Ta2O5, Al2O3, solder resist, polyimide, BCB, PBO, and other material having similar insulating and structural properties. In one embodiment, insulating bumps 130 are made with encapsulant or other dielectric material having a high dielectric constant. Insulating bumps 130 increase an oblique angle transmission and reception area of RF antenna substrate 140 to improve transmission and reception rate or gain of the antenna. Further detail of insulating bumps 130 can be found in US patent application, 20190051989, hereby incorporated by reference.

FIG. 2b is a top view of insulating layer 130 on surface 128 as an array of islands 136a, 136b suitable to provide transmission and reception of RF signals, i.e., an RF antenna. In particular, the array of islands 136a, 136b of insulating layer 130 are exposed from surface 128 to improve RF transmission and reception performance and quality. In one embodiment, a first group of islands 136a of insulating layer 130 serves as a first antenna 134a electrically connected through conductive layers 122 to provide RF transmission and reception for a first electrical component. A second group of islands 136b of insulating layer 130 serves as a second antenna 134b electrically connected through conductive layers 122 to provide RF transmission and reception for a second electrical component. Although two RF antennas 134a-134b are shown in FIGS. 2a-2b for purposes of a simplified description, RF antenna substrate 140 can have any number of RF antenna like 134a-134b.

Figure 2D:
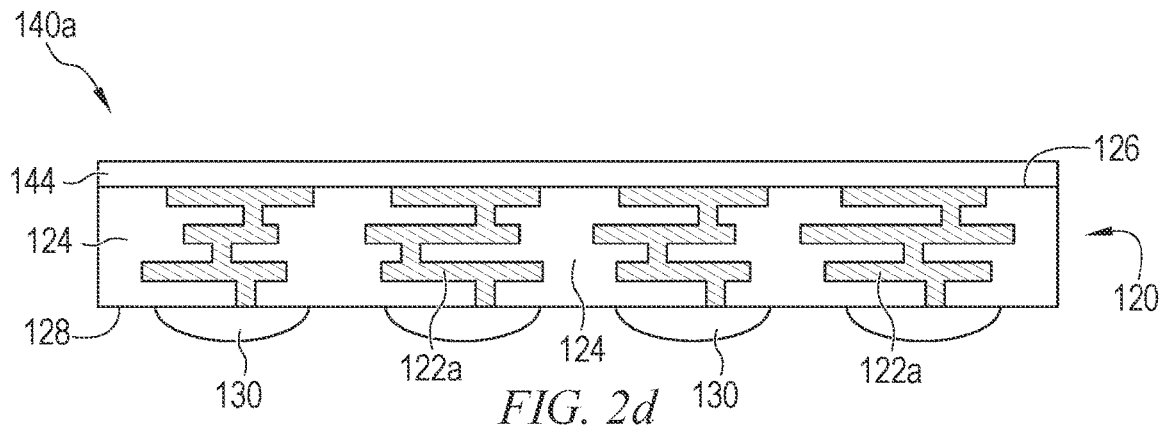

In FIG. 2c, masking tape 144 is applied over surface 126 of RF antenna substrate 140. RF antenna substrate 140 is singulated with saw blade or laser cutting tool 146 into individual RF antenna substrates 140a and 140b. FIG. 2d shows RF antenna substrate 140a post singulation. Although further processing is described in the context of RF antenna substrate 140a, the same would apply to RF antenna substrate 140b.

Figure 2E:
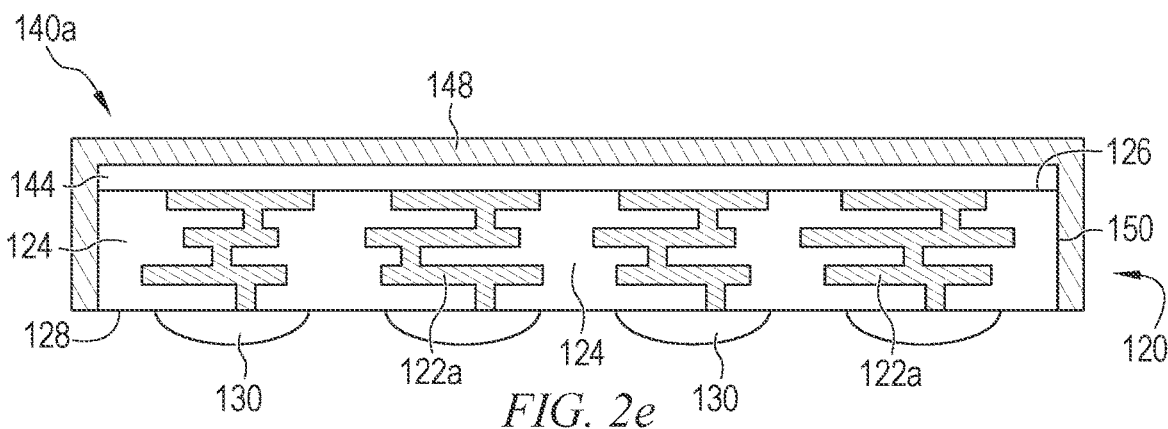

In FIG. 2e, electromagnetic shielding material 148 is conformally applied over masking tape 144 on surface 126, as well as side surfaces 150 of RF antenna substrate 140a. Electromagnetic shielding material 148 can be one or more layers of Al, Cu, Sn, Ni, Au, Ag, or other suitable conductive material. Alternatively, electromagnetic shielding material 148 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

In one embodiment, protective layer 148 is metal or other rigid coating applied by sputtering.

Figure 2F:
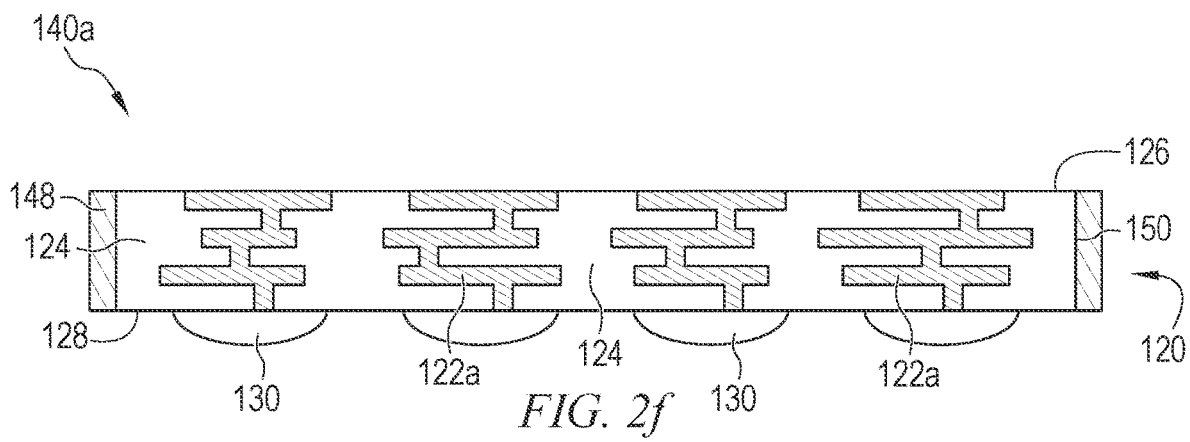

In FIG. 2f, masking tape 144 is peeled off taking with it the portion of protective layer 148 over surface 126. Protective layer 148 remains on side surfaces 150 of RF antenna substrate 140a. RF antenna substrate 140a, as in FIG. 2f, will be used in later processing.

FIG. 3a shows a cross-sectional view of interconnect substrate 160 including conductive layers 162 and insulating layer 164. Conductive layer 162 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 162 provides horizontal electrical interconnect across substrate 160 and vertical electrical interconnect between top surface 166 and bottom surface 168 of substrate 160. Portions of conductive layer 162 can be electrically common or electrically isolated depending on the design and function of semiconductor die 104 and other electrical components. Insulating layer 164 contains one or more layers of SiO2, Si3N4, SiON, Ta2O5, Al2O3, solder resist, polyimide, BCB, PBO, and other material having similar insulating and structural properties. Insulating layers can be formed using PVD, CVD, printing, lamination, spin coating, spray coating, sintering or thermal oxidation. Insulating layer 164 provides isolation between conductive layers 162.

In FIG. 3b, a plurality of electrical components 170a-170c is disposed on surface 166 of interconnect substrate 160 and electrically and mechanically connected to conductive layers 162. Electrical components 170a-170c are each positioned over substrate 160 using a pick and place operation. For example, electrical component 170a can be similar to semiconductor die 104 from FIG. 1c with active surface 110 and bumps 114 oriented toward surface 166 of substrate 160. Electrical components 170b and 170c can be discrete electrical devices, or IPDs, such as a diode, transistor, resistor, capacitor, and inductor, with terminals 172 disposed on surface 166 of interconnect substrate 160 and electrically and mechanically connected to conductive layers 162. Alternatively, electrical components 170a-170c can include other semiconductor die, semiconductor packages, surface mount devices, discrete electrical devices, or IPDs.

FIG. 3c illustrates electrical components 170a-170c electrically and mechanically connected to conductive layers 162 of substrate 160. A plurality of conductive posts or metal bars 176 is formed over surface 166 of substrate 160 between electrical components 170a-170c. Conductive posts 176 can be formed prior to mounting electrical components 170a-170c. In any case, a solder resist can be formed over surface 166. The solder resist is etched to form vias for the locations of the conductive posts. The vias are filled with conductive material and the solder resist is removed leaving conductive posts 176. Conductive posts 176 can be a compartmental shield.

Figure 3D:
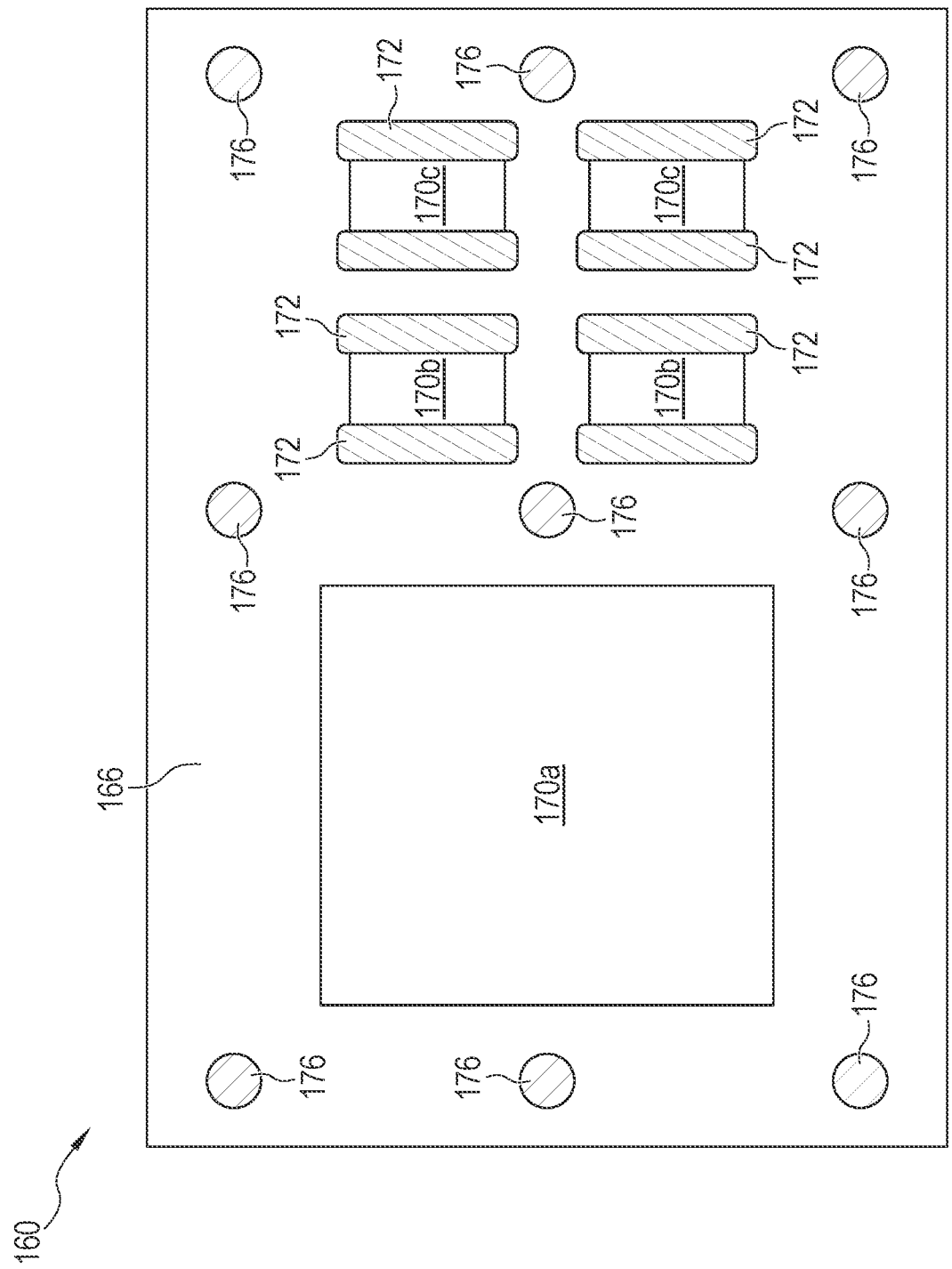
Figure 3E:
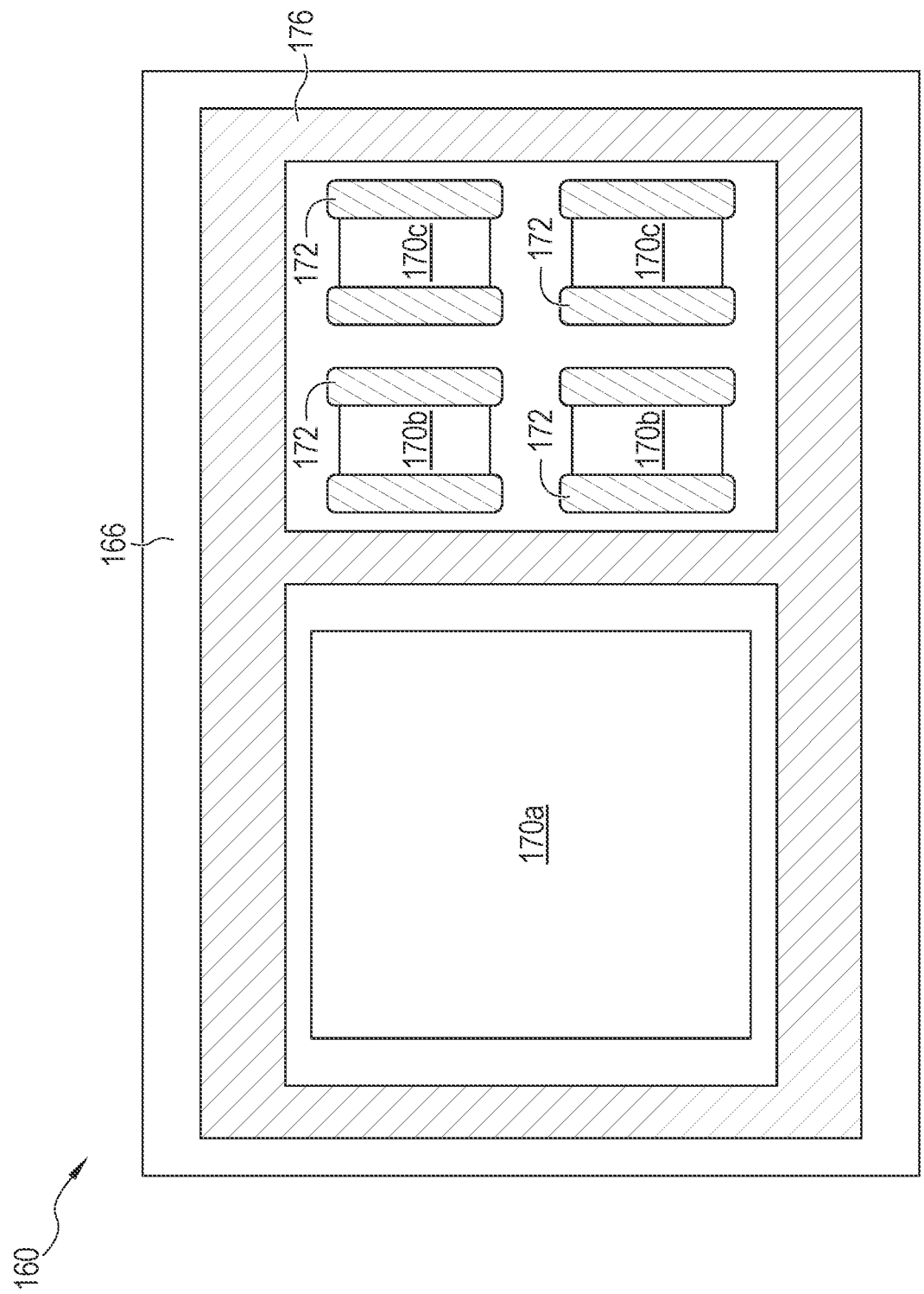

FIG. 3d is a top view of conductive posts 176 disposed on surface 166 of substrate 160 around electrical components 170a-170c. In another embodiment, conductive post 176 can be a continuous or semi-continuous frame structure, as shown in FIG. 3e.

Figure 3F:
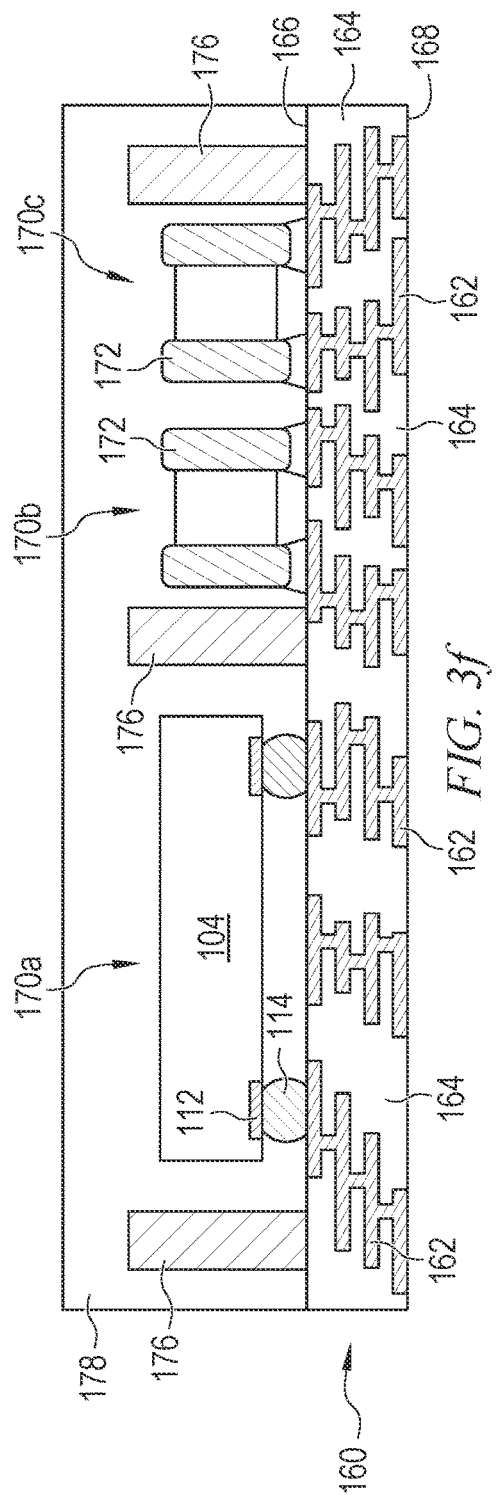

In FIG. 3f, an encapsulant or molding compound 178 is deposited over and around electrical components 170a-170c, conductive posts or frame structure 176, and surface 166 of substrate 160 using a paste printing, compressive molding, transfer molding, liquid encapsulant molding, vacuum lamination, spin coating, or other suitable applicator. Encapsulant 178 can be polymer composite material, such as epoxy resin with filler, epoxy acrylate with filler, or polymer with proper filler. Encapsulant 178 is non-conductive, provides structural support, and environmentally protects the semiconductor device from external elements and contaminants.

Figure 3G:
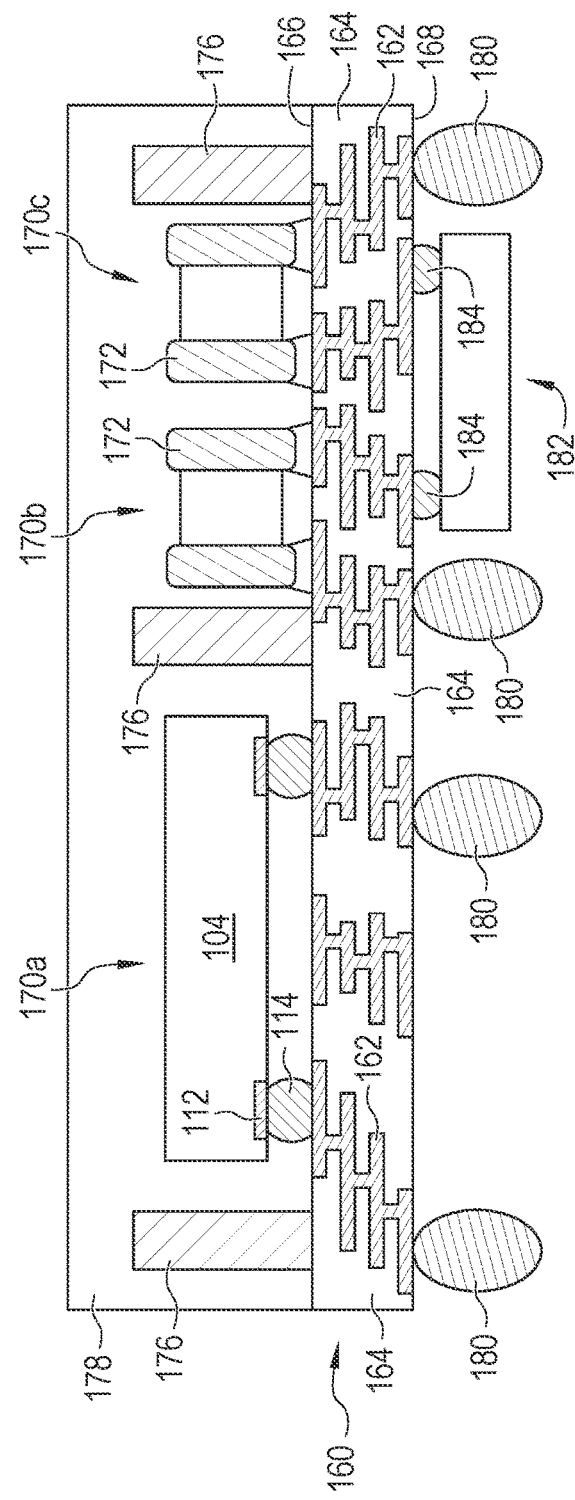

In FIG. 3g, an electrically conductive bump material is deposited over conductive layer 162 on surface 168 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form balls or bumps 180. In one embodiment, bump 180 is formed over a UBM having a wetting layer, barrier layer, and adhesive layer. Bump 180 can also be compression bonded or thermocompression bonded to conductive layer 162. In one embodiment, bump 180 is a copper core bump for durability and maintaining its height. Bump 180 represents one type of interconnect structure that can be formed over conductive layer 162. The interconnect structure can also use bond wires, conductive paste, stud bump, micro bump, or other electrical interconnect.

Electrical component 182 is disposed on surface 168 of interconnect substrate 160 and electrically and mechanically connected to conductive layers 162. Electrical component 182 is positioned over substrate 160 using a pick and place operation. For example, electrical component 182 can be similar to semiconductor die 104 from FIG. 1c, although possibly with a different form and function, with bumps 184 oriented toward surface 168 of substrate 160. Electrical component 182 can be a discrete electrical device, or IPD, such as a diode, transistor, resistor, capacitor, and inductor. Alternatively, electrical component 182 can include other semiconductor die, semiconductor packages, surface mount devices, discrete electrical devices, or IPDs.

Figure 3H:
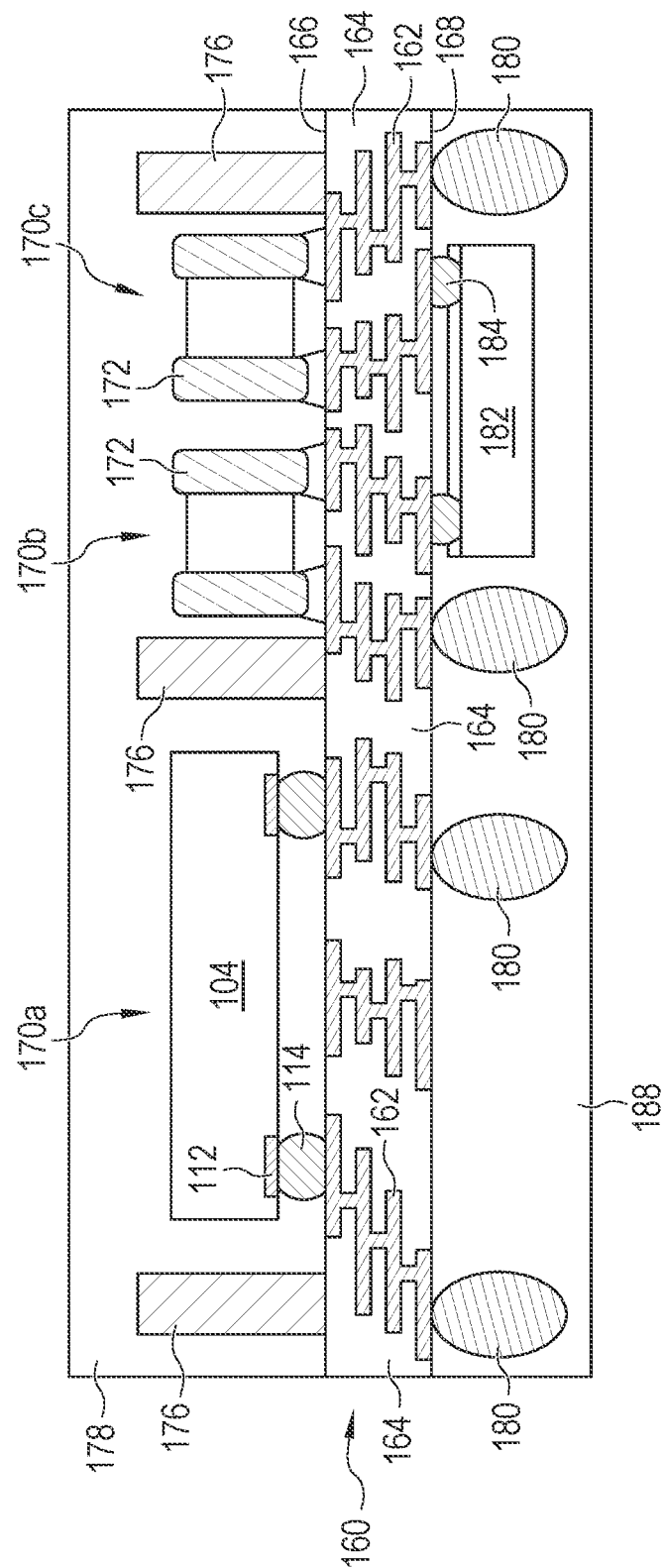

In FIG. 3h, an encapsulant or molding compound 188 is deposited over and around electrical component 182, bumps 180, and surface 168 of substrate 160 using a paste printing, compressive molding, transfer molding, liquid encapsulant molding, vacuum lamination, spin coating, or other suitable applicator. Encapsulant 188 can be polymer composite material, such as epoxy resin with filler, epoxy acrylate with filler, or polymer with proper filler. Encapsulant 188 is non-conductive, provides structural support, and environmentally protects the semiconductor device from external elements and contaminants.

Figure 3I:
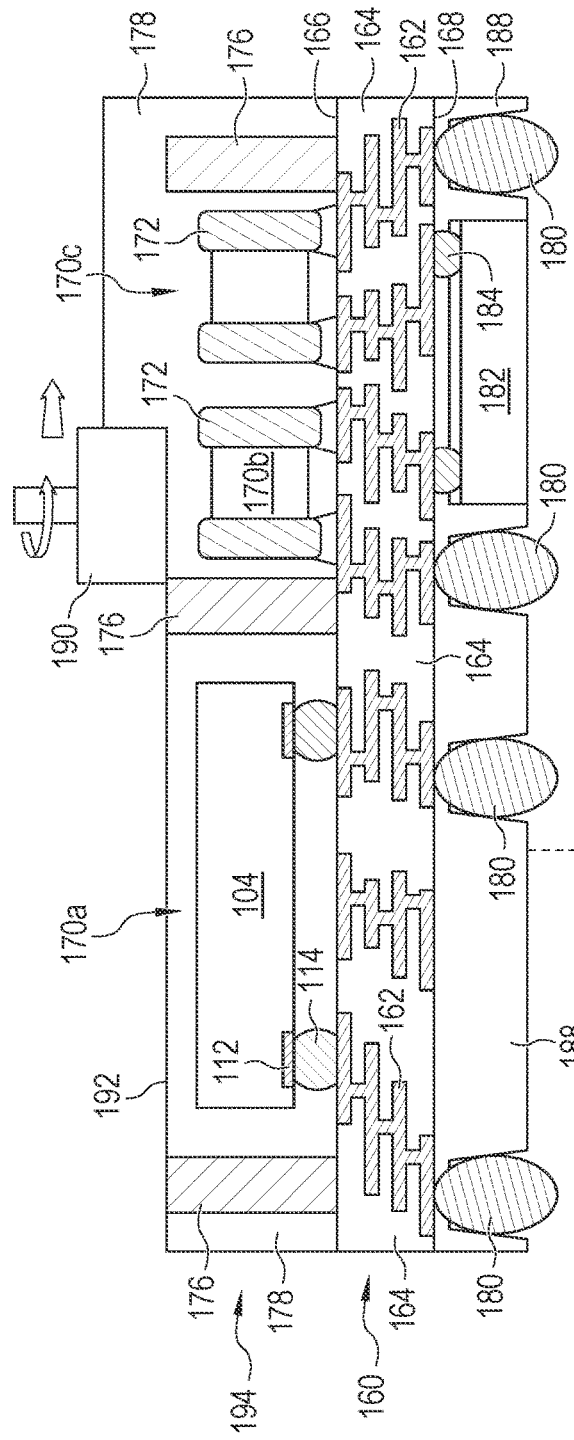

In FIG. 3i, a portion of encapsulant 178 is removed with grinder 190 or laser direct ablation (LDA) leaving a planar surface 192 on encapsulant 178 and exposing conductive posts or frame structure 176. A portion of encapsulant 188 is removed by an etching process or LDA using laser 191 to expose bumps 180.

The combination of electrical components 170a-170c, 182 disposed on substrate 160 and covered by encapsulant 178, 188 constitutes system-in-package (SiP) module 194.

Electrical components 170a-170c may contain IPDs that are susceptible to or generate EMI, RFI, harmonic distortion, and inter-device interference. For example, the IPDs contained within electrical components 170a-170c provide the electrical characteristics needed for high-frequency applications, such as resonators, high-pass filters, low-pass filters, band-pass filters, symmetric Hi-Q resonant transformers, and tuning capacitors. In another embodiment, electrical components 170a-170c contain digital circuits switching at a high frequency, which could interfere with the operation of other IPDs in SiP module or component module 194.

Figure 3J:
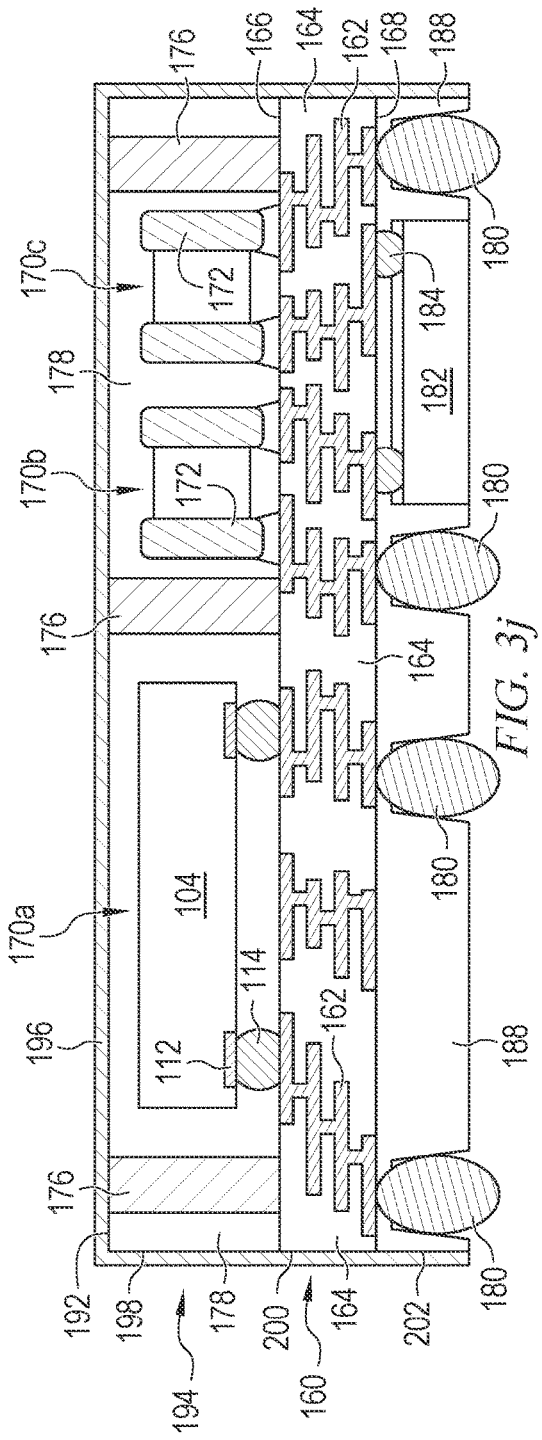

To address EMI, RFI, harmonic distortion, and inter-device interference, electromagnetic shielding material 196 is applied over top surface 192 and side surface 198 of encapsulant 178 and surface 200 of substrate 160 and side surface 202 of encapsulant 188, as shown in FIG. 3j. Electromagnetic shielding material 196 can be one or more layers of Al, Cu, Sn, Ni, Au, Ag, or other suitable conductive material. Alternatively, electromagnetic shielding material 196 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding material 196 is grounded through conductive posts or frame structure 176.

Figure 4A:
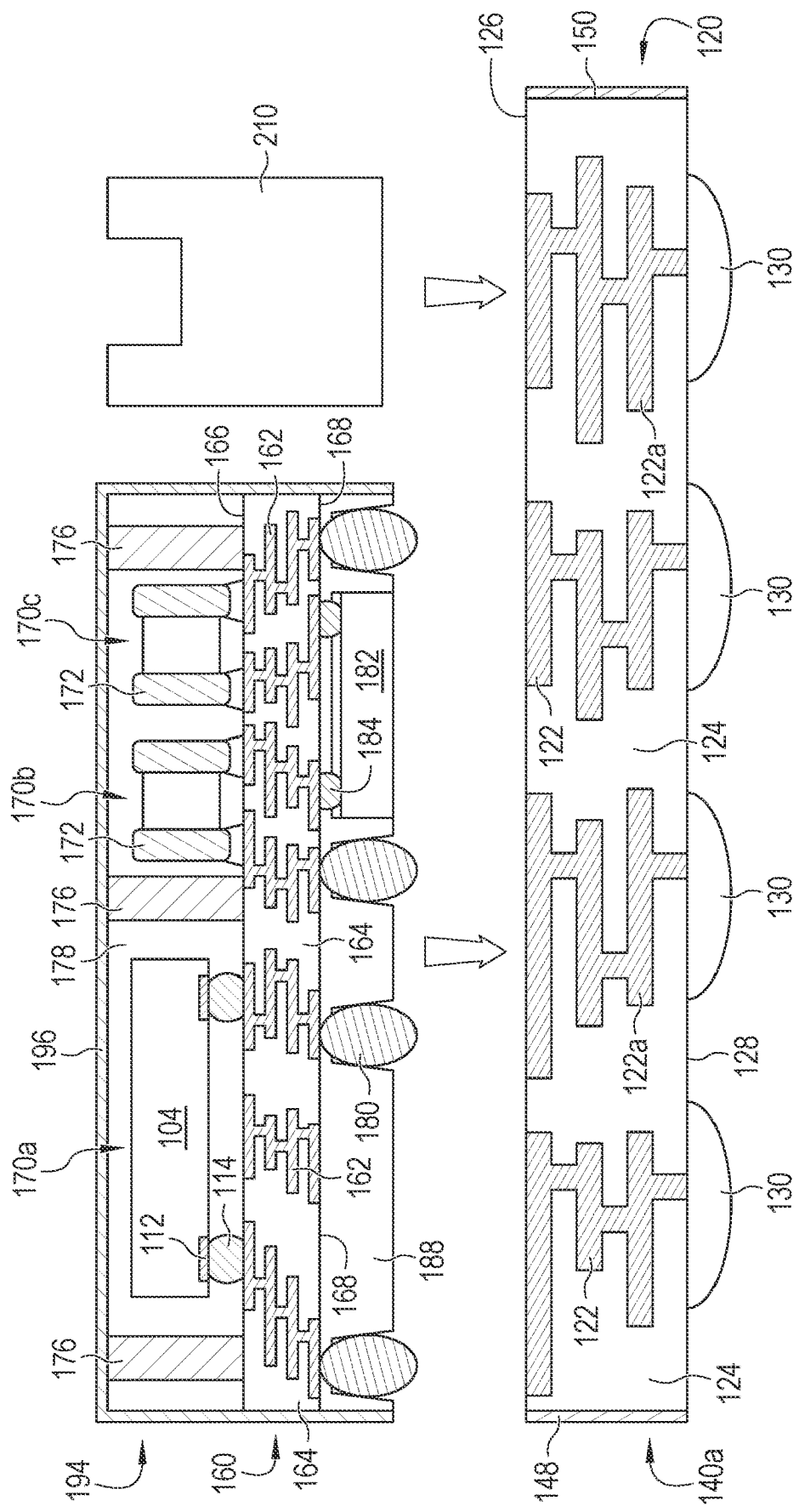
FIGS. 4a-4c illustrate integration of the RF antenna and SiP module with shielding and heat sink.
Figure 4B:
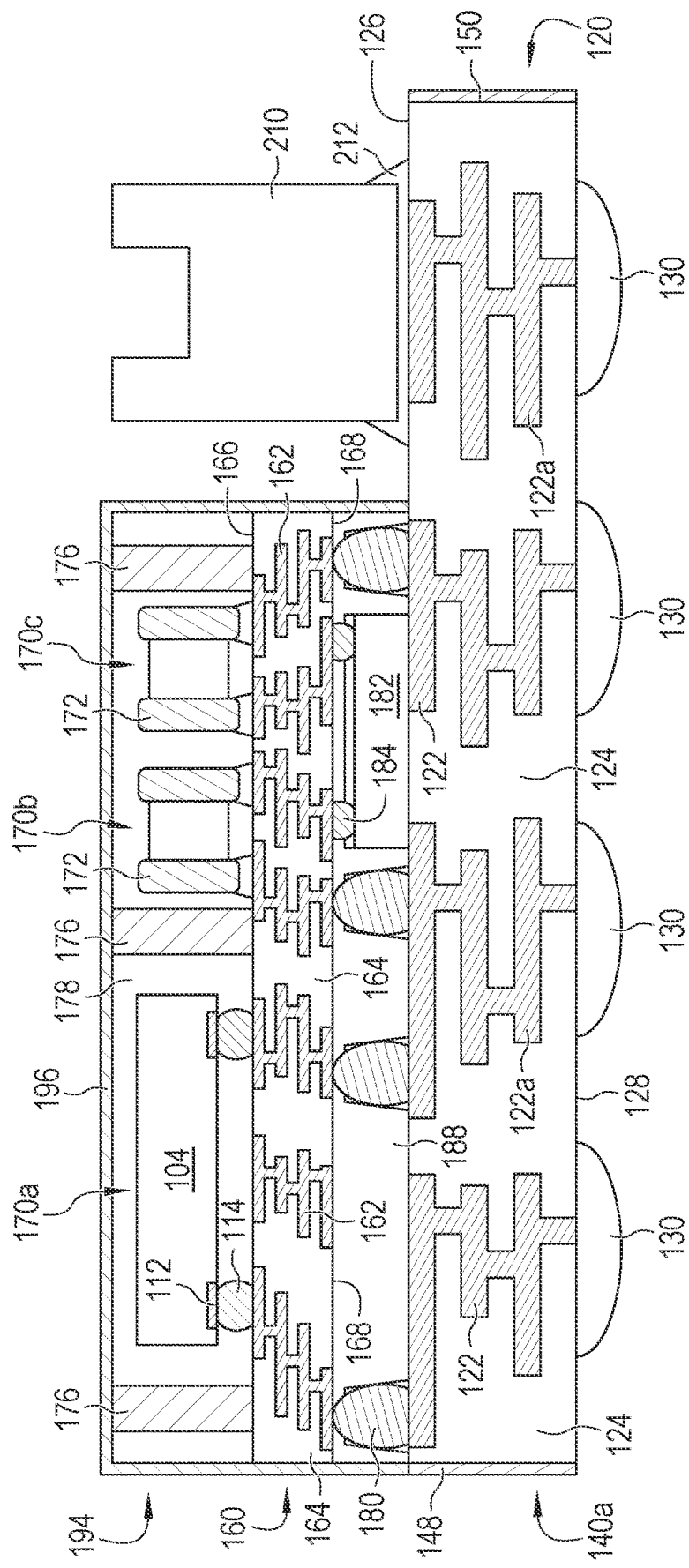

Turning to FIG. 4a, SiP module 194 with electromagnetic shielding material 196 from FIG. 3j, and electrical connector 210, are positioned over surface 126 of RF antenna substrate 140a from FIG. 2f. In one embodiment, connector 210 is a board to board (B2B) connector. RF antenna substrate 140a can be supported by a carrier (not shown) during the mounting of SiP module 194. FIG. 4b shows SiP module 194, with electromagnetic shielding material 196, disposed on RF antenna substrate 140a with bumps 180 electrically and mechanically connected to conductive layer 122 on surface 126. Electrical connector 210 is shown disposed on surface 126 of RF antenna substrate 140a with electrical and mechanical connection to conductive layers 122 with bumps or conductive paste 212. Electrical connector 210 is electrically connected through conductive layer 122 of RF antenna substrate 140a to antenna 134a and electrical components 170a-170c and 182 through bumps 180 and interconnect substrate 120.

Figure 4C:
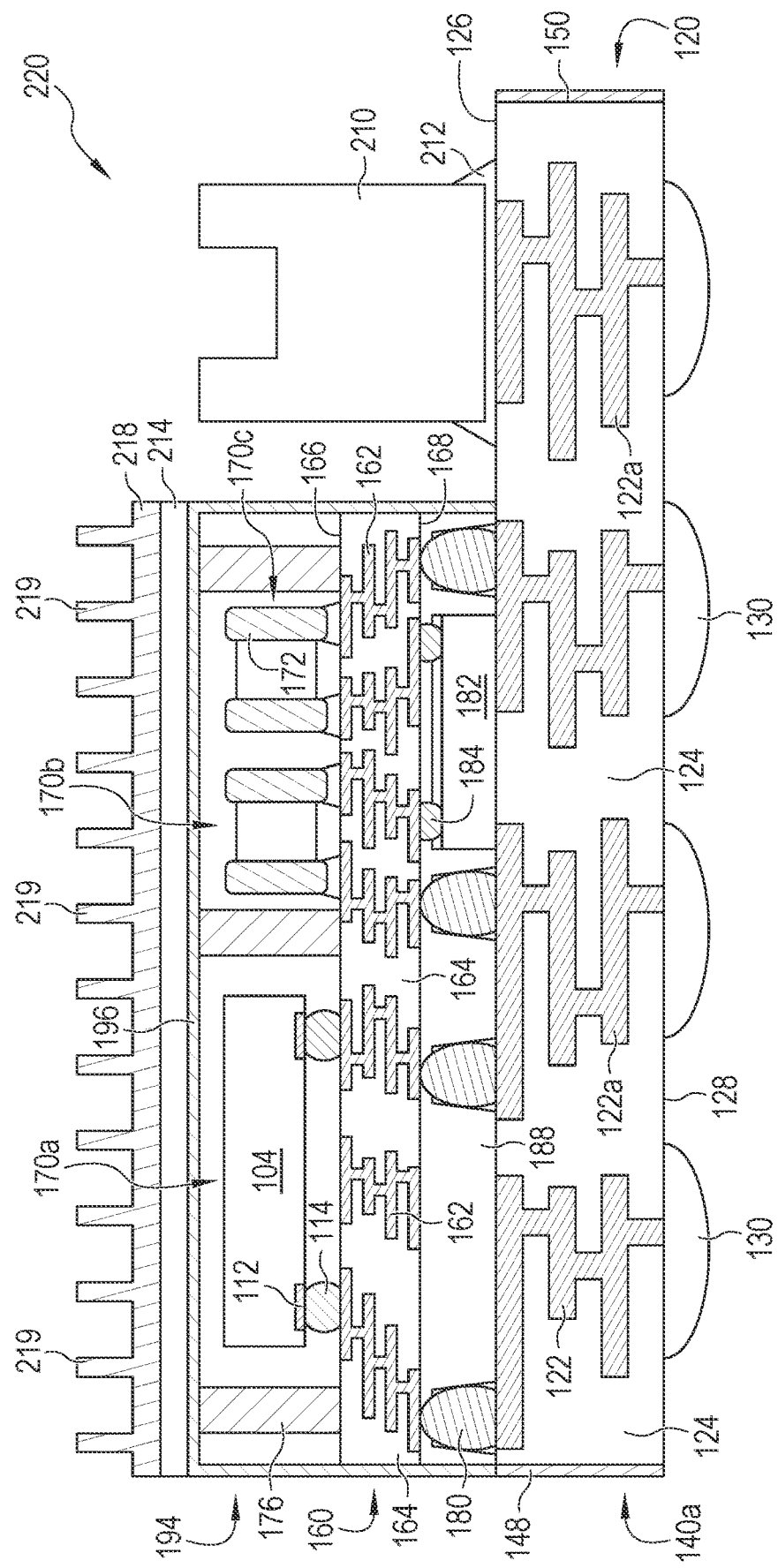

In FIG. 4c, thermal interface material (TIM) 214 is deposited on electromagnetic shielding material 196. In one embodiment, TIM 214 is an adhesive with filler containing alumina, Al, aluminum zinc oxide, or other material having good heat transfer properties.

Heat sink or heat spreader 218 is disposed over TIM 214 with an adhesive, or by nature of the adhesive property of the TIM. Heat sink 218 can be one or more layers of Al, Cu, Sn, Ni, Au, Ag, or other suitable thermally conductive material. Heat sink 218 dissipates heat generated by SiP module 194 and transferred through TIM 214 to the heat sink. Fins 219 provide additional surface area to dissipate heat.

The combination of RF antenna substrate 140a, electrical connector 210, SiP module 194 with electromagnetic shielding material 196, TIM 214, and heat sink 218 constitutes antenna-on-package (AoP) 220. AoP 220 is an integrated RF antenna substrate and SiP module applicable to wireless telecommunications, such as 5G cellular. AoP 220 provides reduced interface pitch, higher interface pin-counts, reduced thickness and higher level package technology, while accounting for the associated EMI and heat generation with integrated shielding and heat sink. In particular, conductive posts or frame structure 176 aids in heat dissipation and provides grounding for the EMI shielding. Conductive posts or frame structure 176 also increase stiffness of the package to reduce warpage.

Figure 5:
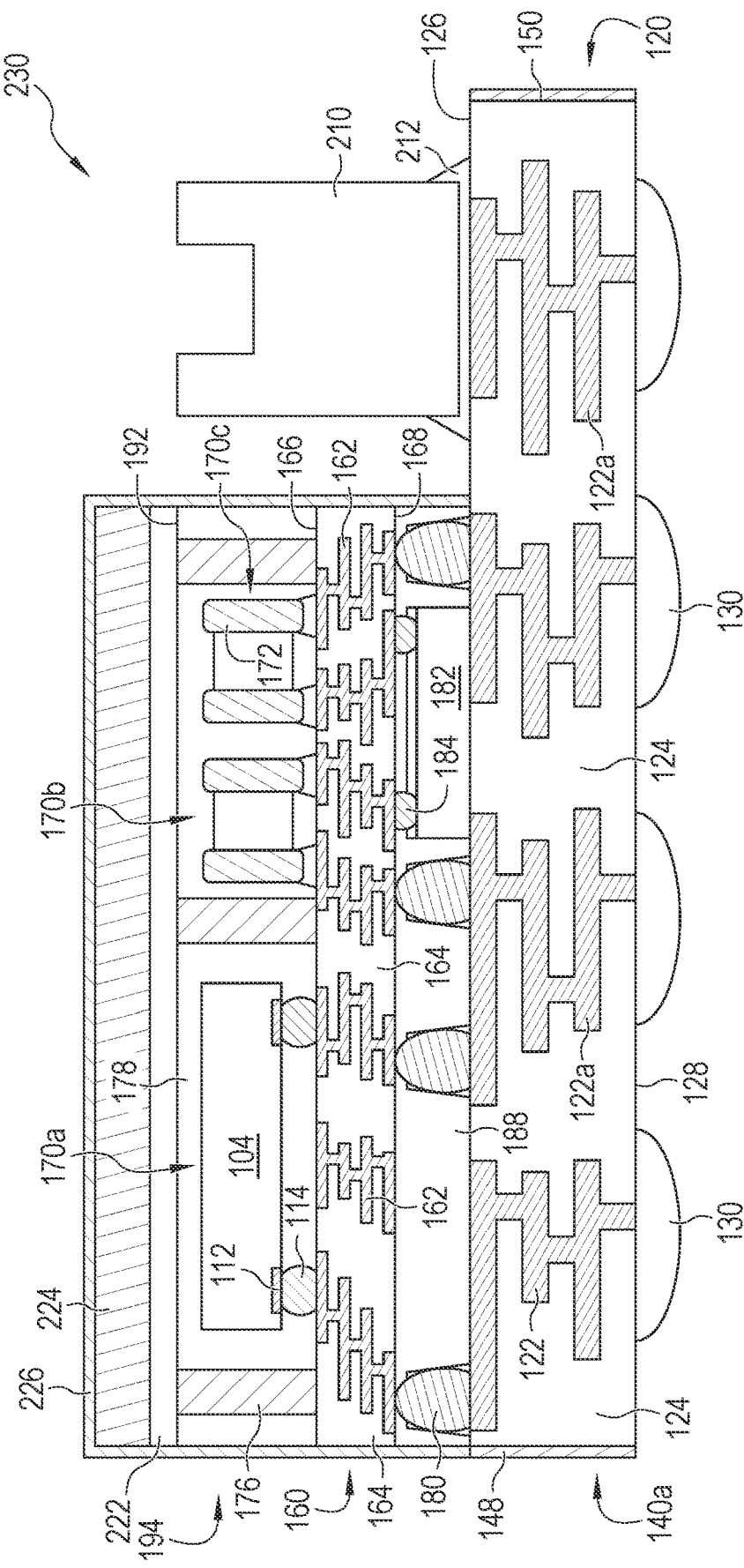
FIG. 5 illustrate another embodiment of the RF antenna and SiP module with shielding and heat sink.

In another embodiment, continuing from FIG. 3i, SiP module 194 is disposed on RF antenna substrate 140a with bumps 180 electrically and mechanically connected to conductive layer 122 on surface 126, as shown in FIG. 5. Electrical connector 210 is shown disposed on surface 126 of RF antenna substrate 140a with electrical and mechanical connection to conductive layers 122 with bumps or conductive paste 212. Elements having a similar function are assigned the same reference number in the figures. Dimensions as shown are not necessarily drawn to scale in the figures.

TIM 222 is deposited on surface 192 of encapsulant 178. In one embodiment, TIM 222 is an adhesive with filler containing alumina, Al, aluminum zinc oxide, or other material having good heat transfer properties. Heat sink or heat spreader 224 is disposed over TIM 222 with an adhesive, or by nature of the adhesive property of the TIM. Heat sink 224 can be one or more layers of Al, Cu, Sn, Ni, Au, Ag, or other suitable thermally conductive material. Heat sink 224 dissipates heat generated by SiP module 194 and transferred through TIM 222 to the heat sink.

Electromagnetic shielding material 226 is applied over heat sink 224 and side surfaces of SiP module 194. Electromagnetic shielding material 226 can be one or more layers of Al, Cu, Sn, Ni, Au, Ag, or other suitable conductive material. Alternatively, electromagnetic shielding material 226 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference.

The combination of RF antenna substrate 140a, electrical connector 210, SiP module 194, TIM 222, heat sink 224, and electromagnetic shielding material 226 constitutes AoP 230. AoP 230 is an integrated RF antenna substrate and SiP module applicable to wireless telecommunications, such as 5G cellular. AoP 230 provides reduced interface pitch, higher interface pin-counts, reduced thickness and higher level package technology, while accounting for the associated EMI and heat generation with integrated shielding and heat sink. In particular, conductive posts or frame structure 176 aids in heat dissipation and increases stiffness of the package to reduce warpage.

In another embodiment, a plurality of electrical components 232a-232c is disposed on surface 126 of RF antenna substrate 140a and electrically and mechanically connected to conductive layers 122. Electrical components 232a-232c are each positioned over surface 126 of RF antenna substrate 140a using a pick and place operation, similar to FIG. 3b. For example, electrical component 232a can be similar to semiconductor die 104 from FIG. 1c. Electrical components 232b and 232c can be discrete electrical devices, or IPDs, such as a diode, transistor, resistor, capacitor, and inductor, with terminals 234 disposed on surface 126 of RF antenna substrate 140a and electrically and mechanically connected to conductive layers 122. Alternatively, electrical components 232a-232c can include other semiconductor die, semiconductor packages, surface mount devices, discrete electrical devices, or IPDs.

A plurality of conductive posts or metal bars 236 is formed over surface 126 of RF antenna substrate 140a between electrical components 232a-232c, similar to FIG. 3c. Conductive posts 236 can be formed prior to mounting electrical components 232a-232c. Conductive posts 236 can be a compartmental shield.

Figure 6A:
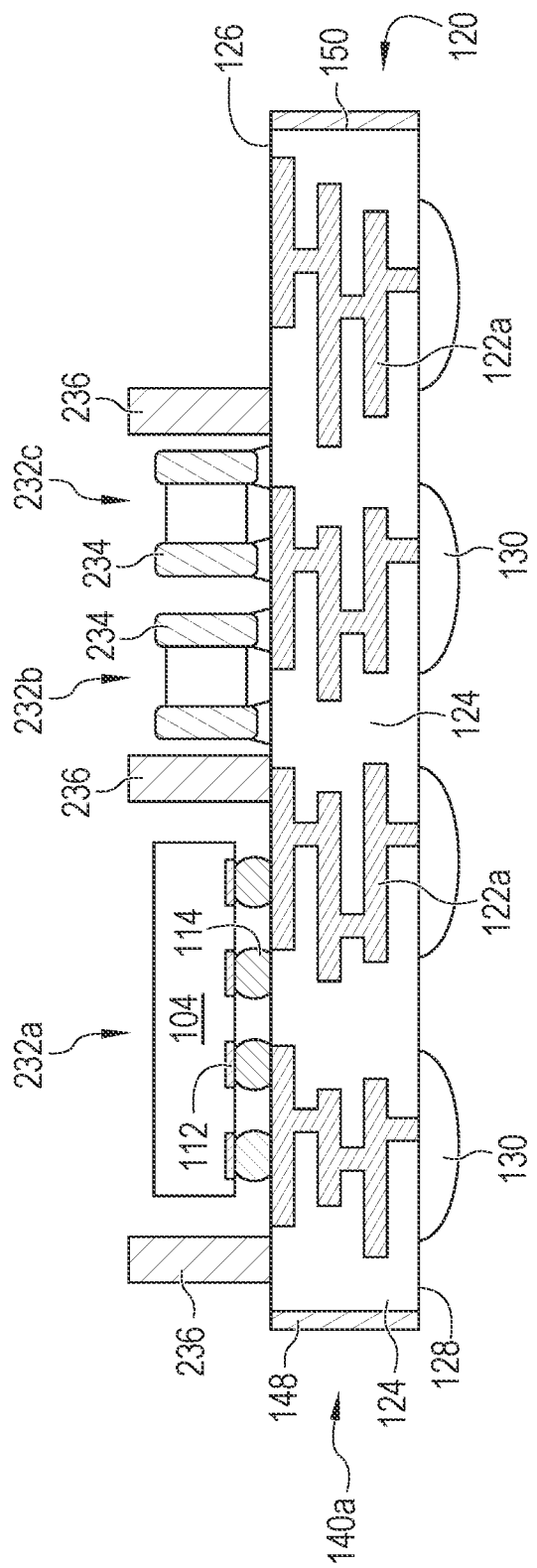
Figure 6B:
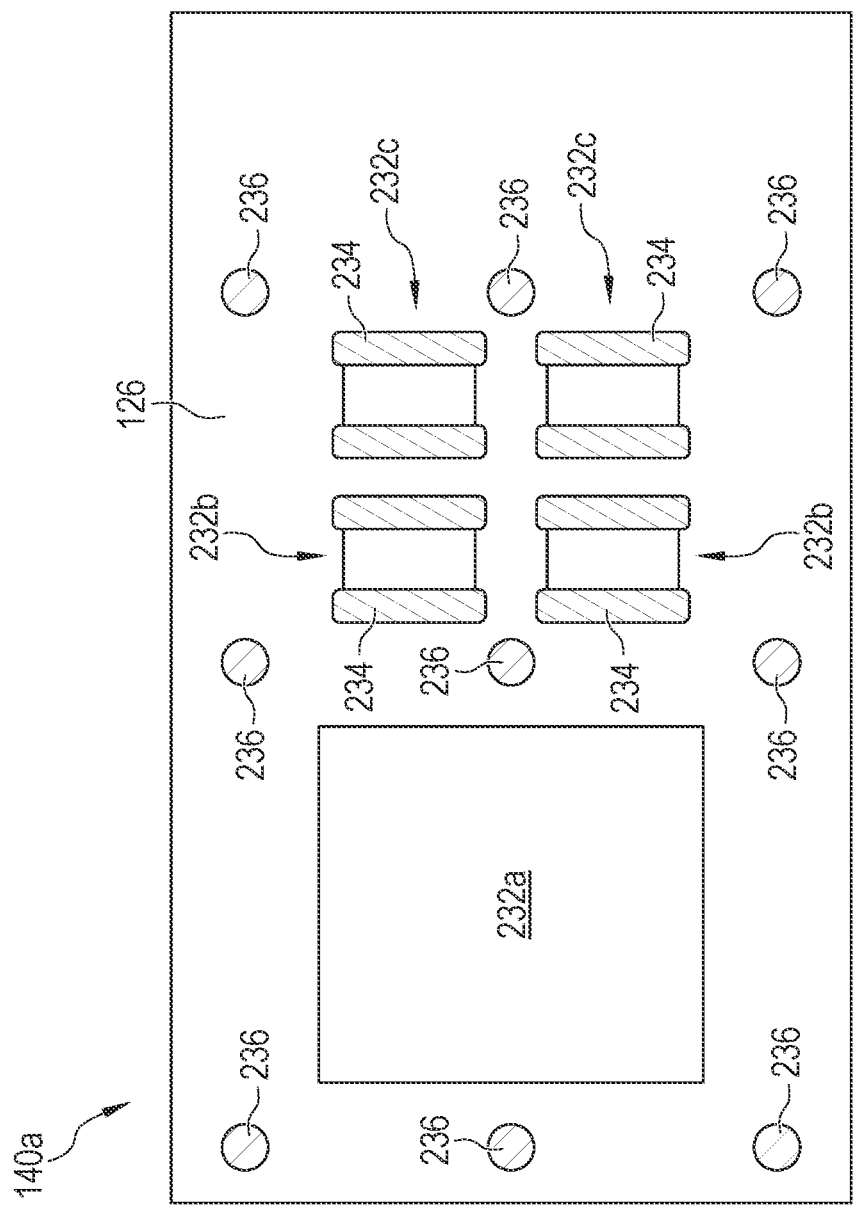
Figure 6C:
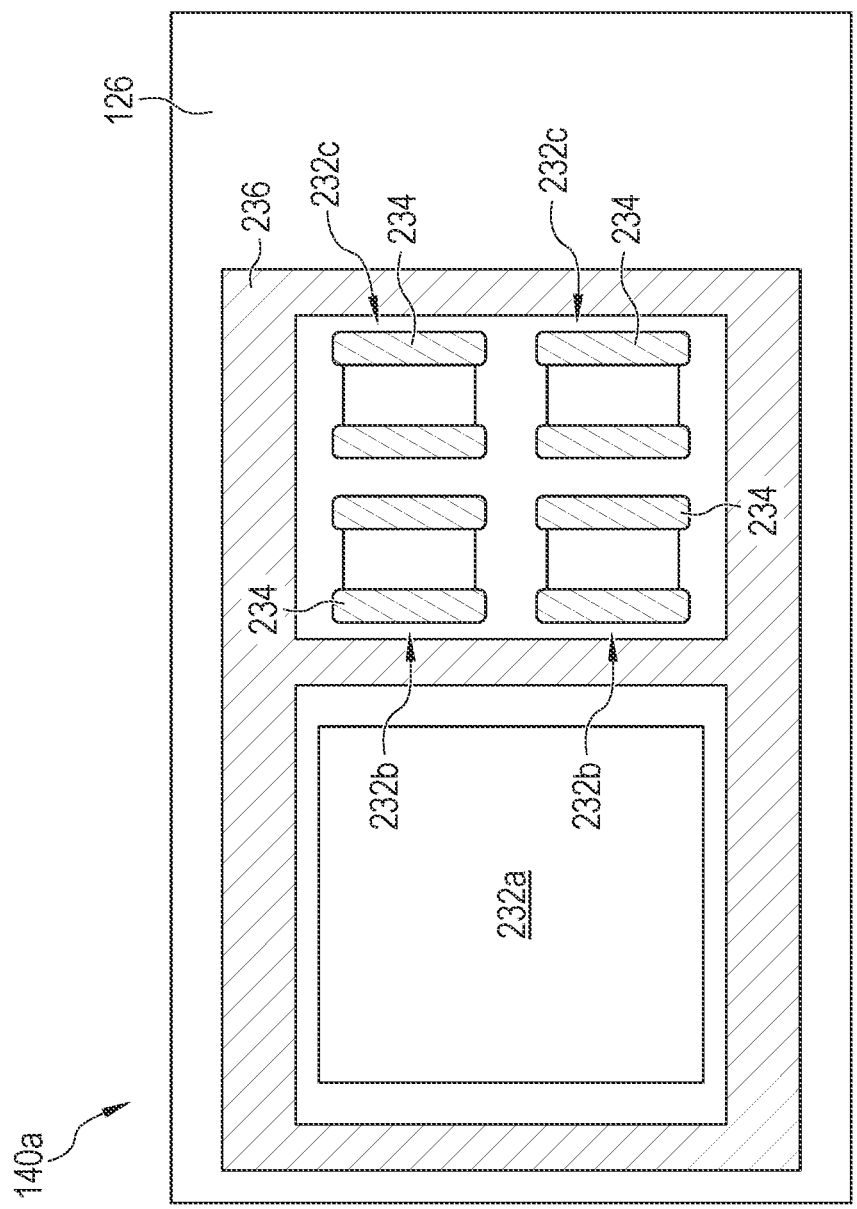

FIG. 6b is a top view of conductive posts 236 disposed on surface 126 of RF antenna substrate 140a around electrical components 232a-232c. In another embodiment, conductive post 236 can be a continuous or semi-continuous frame structure, as shown in FIG. 6c.

In FIG. 6d, an encapsulant or molding compound 238 is deposited over and around electrical components 232a-

232c, conductive posts or frame structure 236, and a portion of surface 126 of RF antenna substrate 140a using a paste printing, compressive molding, transfer molding, liquid encapsulant molding, vacuum lamination, spin coating, or other suitable applicator. Encapsulant 238 is a partial mold as a portion of surface 126 of RF antenna substrate 140a remains free of encapsulant 238 to make room for electrical connector 250, added in later figures. Encapsulant 238 can be polymer composite material, such as epoxy resin with filler, epoxy acrylate with filler, or polymer with proper filler. Encapsulant 238 is non-conductive, provides structural support, and environmentally protects the semiconductor device from external elements and contaminants.

In FIG. 6e, a portion of encapsulant 238 is removed with grinder 240 or LDA leaving a planar surface 242 on encapsulant 238 and exposing conductive posts or frame 236.

Electrical components 232a-232c may contain IPDs that are susceptible to or generate EMI, RFI, harmonic distortion, and inter-device interference. For example, the IPDs contained within electrical components 232a-232c provide the electrical characteristics needed for high-frequency applications, such as resonators, high-pass filters, low-pass filters, band-pass filters, symmetric Hi-Q resonant transformers, and tuning capacitors. In another embodiment, electrical components 232a-232c contain digital circuits switching at a high frequency, which could interfere with the operation of other IPDs.

Figure 6F:
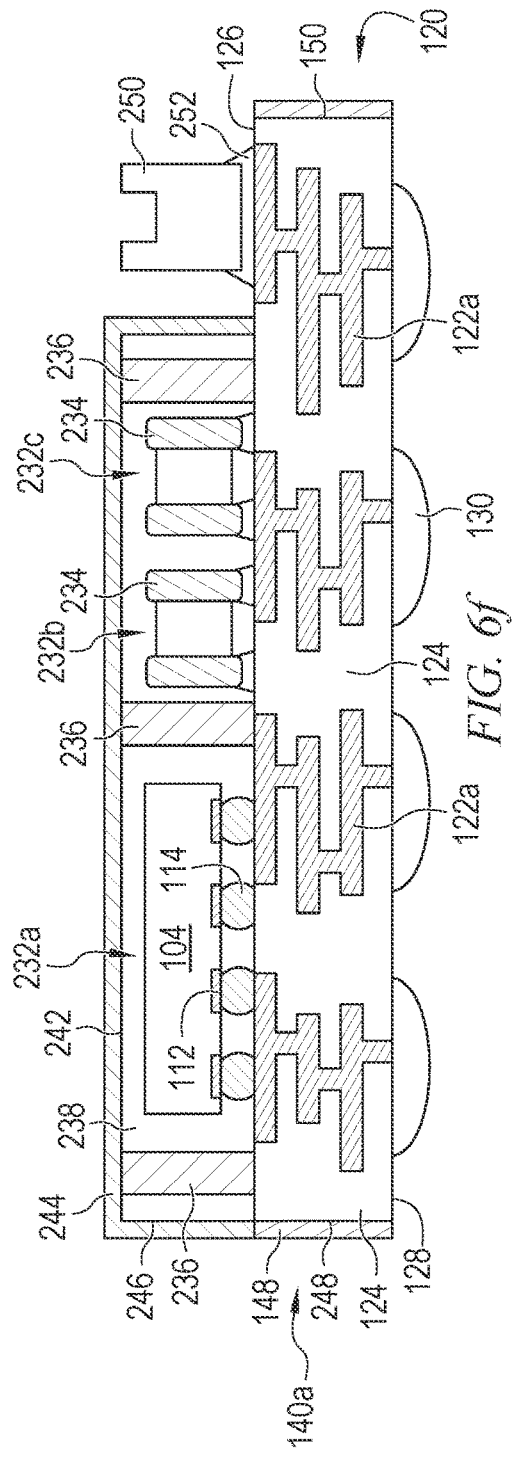

To address EMI, RFI, harmonic distortion, and inter-device interference, electromagnetic shielding material 244 is applied over top surface 242 and side surface 246 of encapsulant 238 and side surface 240 of RF antenna substrate 140a, as shown in FIG. 6f. Electromagnetic shielding material 244 can be one or more layers of Al, Cu, Sn, Ni, Au, Ag, or other suitable conductive material. Alternatively, electromagnetic shielding material 244 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding material 244 is grounded through conductive posts or frame structure 236.

Electrical connector 250 is disposed on surface 126 of RF antenna substrate 140a with electrical and mechanical connection to conductive layers 122 with bumps or conductive paste 252, similar to FIG. 4a-4b. Electrical connector 250 is electrically connected through conductive layer 122 of RF antenna substrate 140a to antenna 134a and electrical components 232a-232c. In one embodiment, connector 250 is a B2B connector.

Figure 6G:
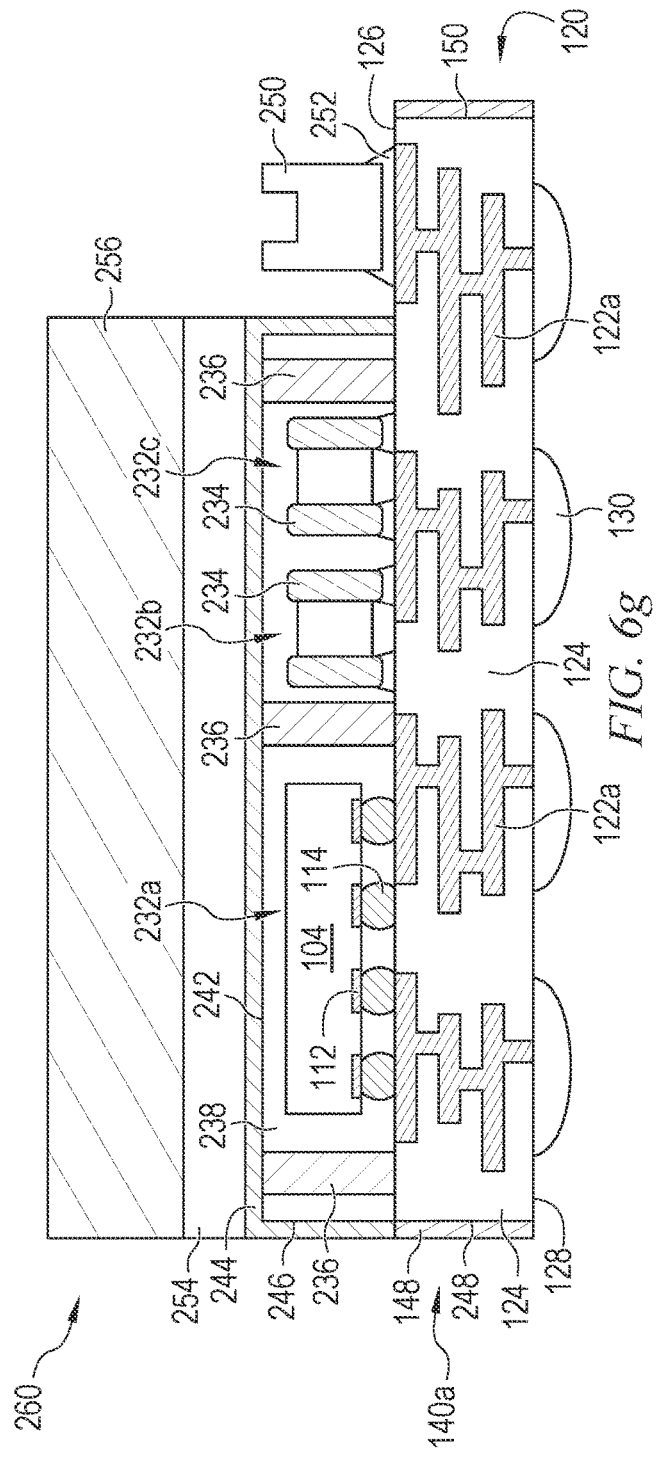

In FIG. 6g, TIM 254 is deposited on electromagnetic shielding material 244. In one embodiment, TIM 254 is an adhesive with filler containing alumina, Al, aluminum zinc oxide, or other material having good heat transfer properties. Heat sink or heat spreader 256 is disposed over TIM 254 with an adhesive, or by nature of the adhesive property of the TIM. Heat sink 256 can be one or more layers of Al, Cu, Sn, Ni, Au, Ag, or other suitable thermally conductive material. Heat sink 256 dissipates heat generated by electrical components 232a-232c and transferred through TIM 254 to the heat sink.

The combination of RF antenna substrate 140a, electrical connector 250, electrical components 232a-232c, electromagnetic shielding material 244, TIM 254, and heat sink 256 constitutes AoP 260. AoP 260 is an integrated RF antenna substrate and SiP module applicable to wireless telecommunications, such as 5G cellular. AoP 260 provides reduced interface pitch, higher interface pin-counts, reduced thickness and higher level package technology, while accounting for the associated EMI and heat generation with integrated shielding and heat sink. In particular, conductive posts or frame structure 236 aids in heat dissipation and provides grounding for the EMI shielding. Conductive posts or frame structure 236 also increases stiffness of the package to reduce warpage.

Figure 7A:
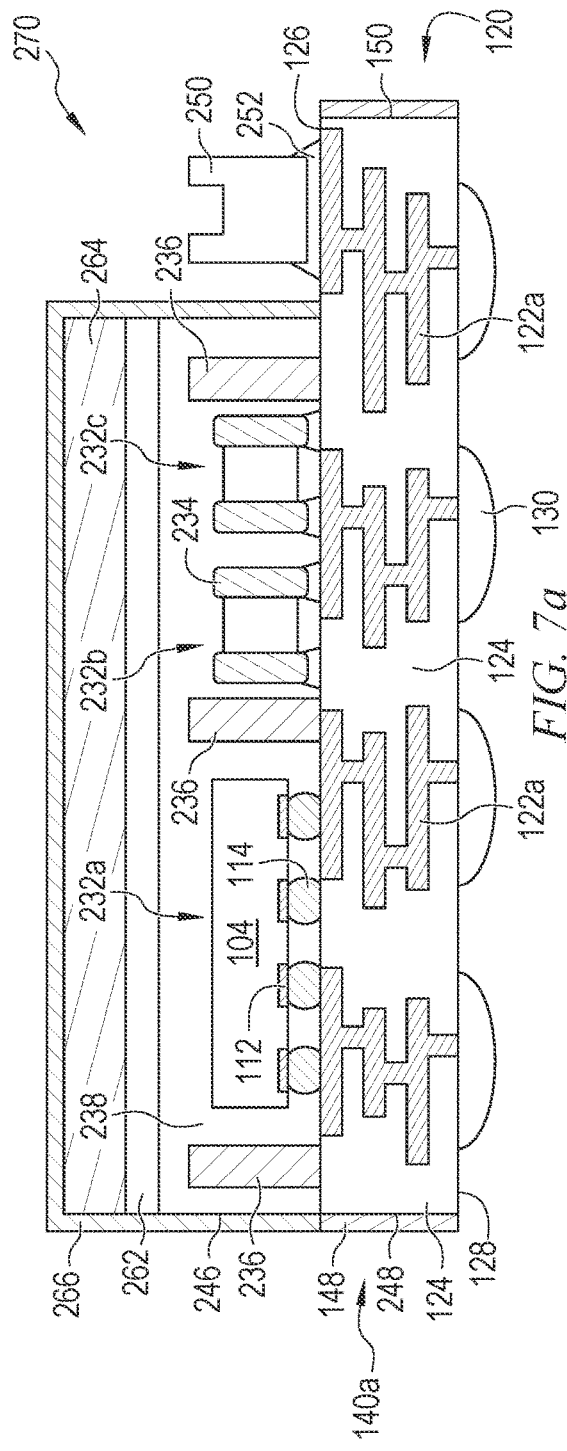
FIGS. 7a-7b illustrates another embodiment of the RF antenna and electrical components with shielding and heat sink.

In another embodiment, continuing from FIG. 6d, TIM 262 is deposited on encapsulant 238, as shown in FIG. 7a. In one embodiment, TIM 262 is an adhesive with filler containing alumina, Al, aluminum zinc oxide, or other material having good heat transfer properties. Heat sink or heat spreader 264 is disposed over TIM 262 with an adhesive, or by nature of the adhesive property of the TIM. Heat sink 264 can be one or more layers of Al, Cu, Sn, Ni, Au, Ag, or other suitable thermally conductive material. Heat sink 264 dissipates heat generated by electrical components 232a-232c and transferred through TIM 262 to the heat sink. Conductive posts or frame structure 236 remain embedded within or below the surface of encapsulant 238 and do not contact TIM 262.

Figure 7B:
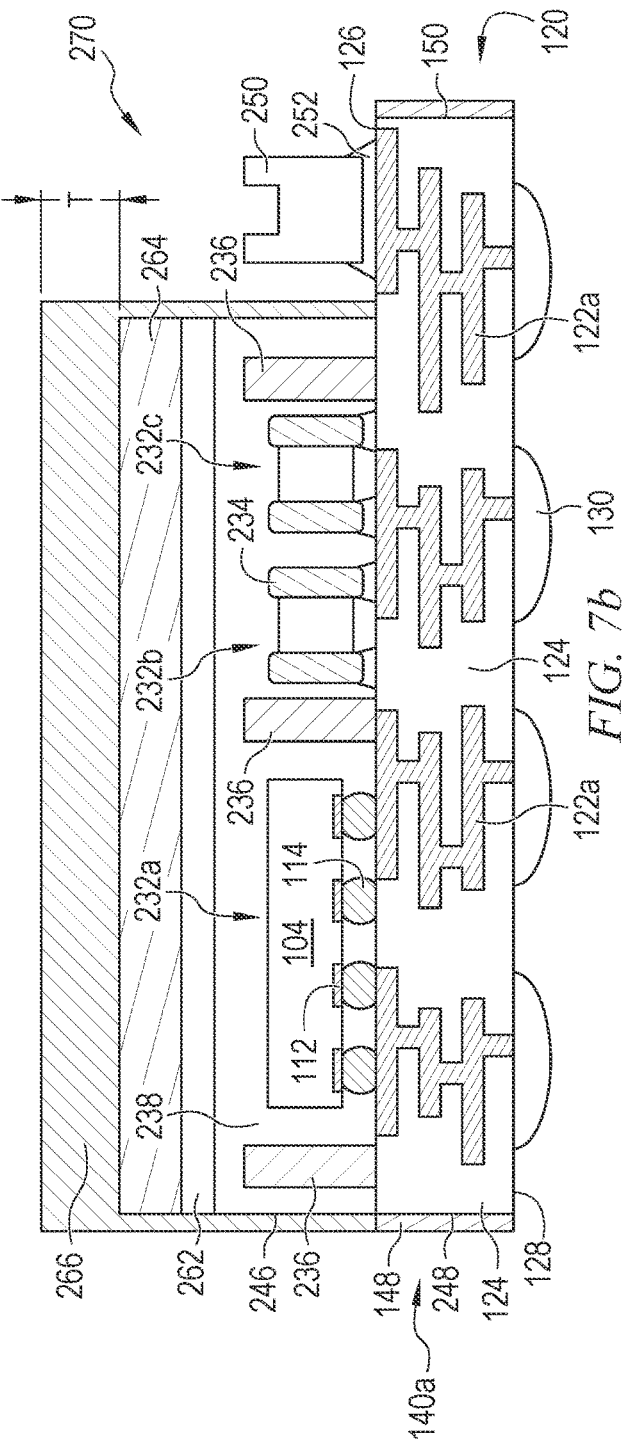

Electromagnetic shielding material 266 is applied over heat sink 264 and side surfaces of encapsulant 238 and RF antenna substrate 140a. Electromagnetic shielding material 266 can be one or more layers of Al, Cu, Sn, Ni, Au, Ag, or other suitable conductive material. Alternatively, electromagnetic shielding material 266 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Electromagnetic shielding material 266 can be made with a thickness T of 5-12 μm, as shown in FIG. 7b.

The combination of RF antenna substrate 140a, electrical connector 250, electrical components 232a-232c, TIM 262, heat sink 264, and electromagnetic shielding material 266 constitutes AoP 270. In some cases, the electromagnetic shielding material is formed over the heat sink, as in FIGS. 5 and 7a-7b. EMI shielding material can be made thicker for enhanced isolation. In other cases, the heat sink is formed over the EMI shielding material, as in FIG. 4c.

In another embodiment, continuing from FIG. 3f, a portion of encapsulant 178 is removed with grinder 272 or LDA leaving a planar surface 273 on encapsulant 178 and exposing conductive posts or frame structure 176, as shown in FIG. 8a.

In FIG. 8b, electromagnetic shielding material 274 is applied over top surface 273 and side surface 275 of encapsulant 178 and side surface 276 of substrate 160. Electromagnetic shielding material 274 can be one or more layers of Al, Cu, Sn, Ni, Au, Ag, or other suitable conductive material. Alternatively, electromagnetic shielding material 274 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding material 274 is grounded through conductive posts or frame structure 176.

Substrate 160 extends out from electrical components 170a-170c to make room for connector 278. Electrical connector 278 is shown disposed on surface 166 of substrate 160 with electrical and mechanical connection to conductive layers 162 with bumps or conductive paste 279. In one embodiment, connector 278 is a B2B connector.

An electrically conductive bump material is deposited over conductive layer 162 on surface 168 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 162 using a suitable attachment or bonding process. In one embodiment, the bump material is reflowed by heating the material above its melting point to form balls or bumps 280. In one embodiment, bump 280 is formed over a UBM having a wetting layer, barrier layer, and adhesive layer. Bump 180 can also be compression bonded or thermocompression bonded to conductive layer 162. In one embodiment, bump 280 is a copper core bump for durability and maintaining its height. Bump 280 represents one type of interconnect structure that can be formed over conductive layer 162. The interconnect structure can also use bond wires, conductive paste, stud bump, micro bump, or other electrical interconnect.

The combination of electrical components 170a-170c disposed on substrate 160 and covered by encapsulant 178 and electrical connector 278 constitutes component module 282.

Figure 8C:
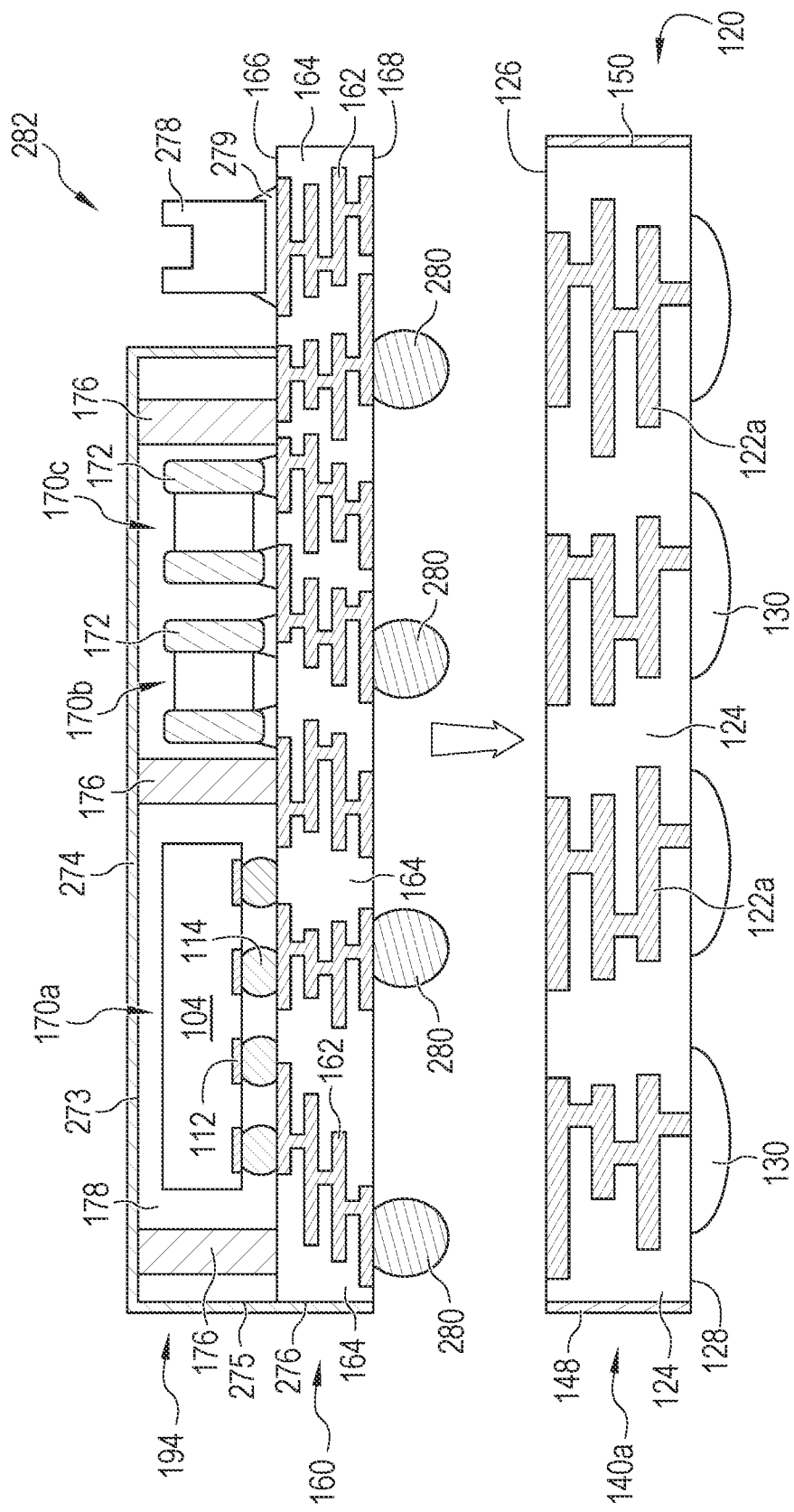
Figure 8D:
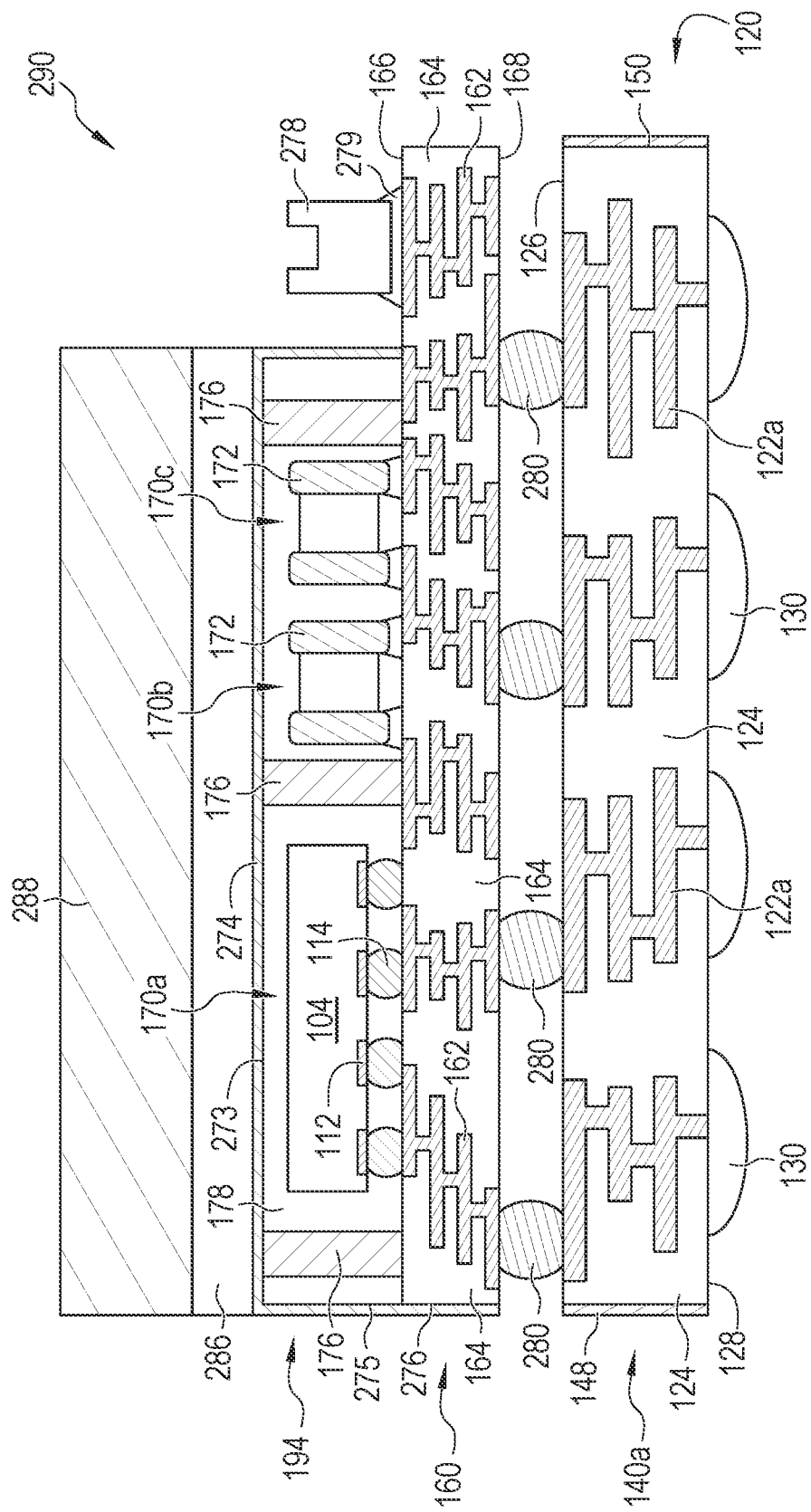

In FIG. 8c, component module 282 is positioned over surface 126 of RF antenna substrate 140a from FIG. 2f. RF antenna substrate 140a can be supported by a carrier (not shown) during the mounting of component module 282. FIG. 8d shows component module 282 disposed on RF antenna substrate 140a with bumps 280 electrically and mechanically connected to conductive layer 122 on surface 126. Electrical connector 278 is electrically connected through conductive layer 162 of interconnect substrate 120, bumps 280, and conductive layer 122 of RF antenna substrate 140a to antenna 134a and electrical components 170a-170c.

TIM 286 is deposited on electromagnetic shielding material 274. In one embodiment, TIM 286 is an adhesive with filler containing alumina, Al, aluminum zinc oxide, or other material having good heat transfer properties.

Heat sink or heat spreader 288 is disposed over TIM 286 with an adhesive, or by nature of the adhesive property of the TIM. Heat sink 288 can be one or more layers of Al, Cu, Sn, Ni, Au, Ag, or other suitable thermally conductive material. Heat sink 288 dissipates heat generated by SiP module 194 and transferred through TIM 286 to the heat sink.

The combination of RF antenna substrate 140a, electrical connector 278, component module 282, TIM 286, and heat sink 288 constitutes AoP 290. AoP 290 is an integrated RF antenna substrate and component module applicable to wireless telecommunications, such as 5G cellular. AoP 290 provides reduced interface pitch, higher interface pin-counts, reduced thickness and higher level package technology, while accounting for the associated EMI and heat generation with integrated shielding and heat sink. In particular, conductive posts or frame structure 236 aids in heat dissipation and provides grounding for the EMI shielding. Conductive posts or frame structure 236 also increase stiffness of the package to reduce warpage.

Figure 9:
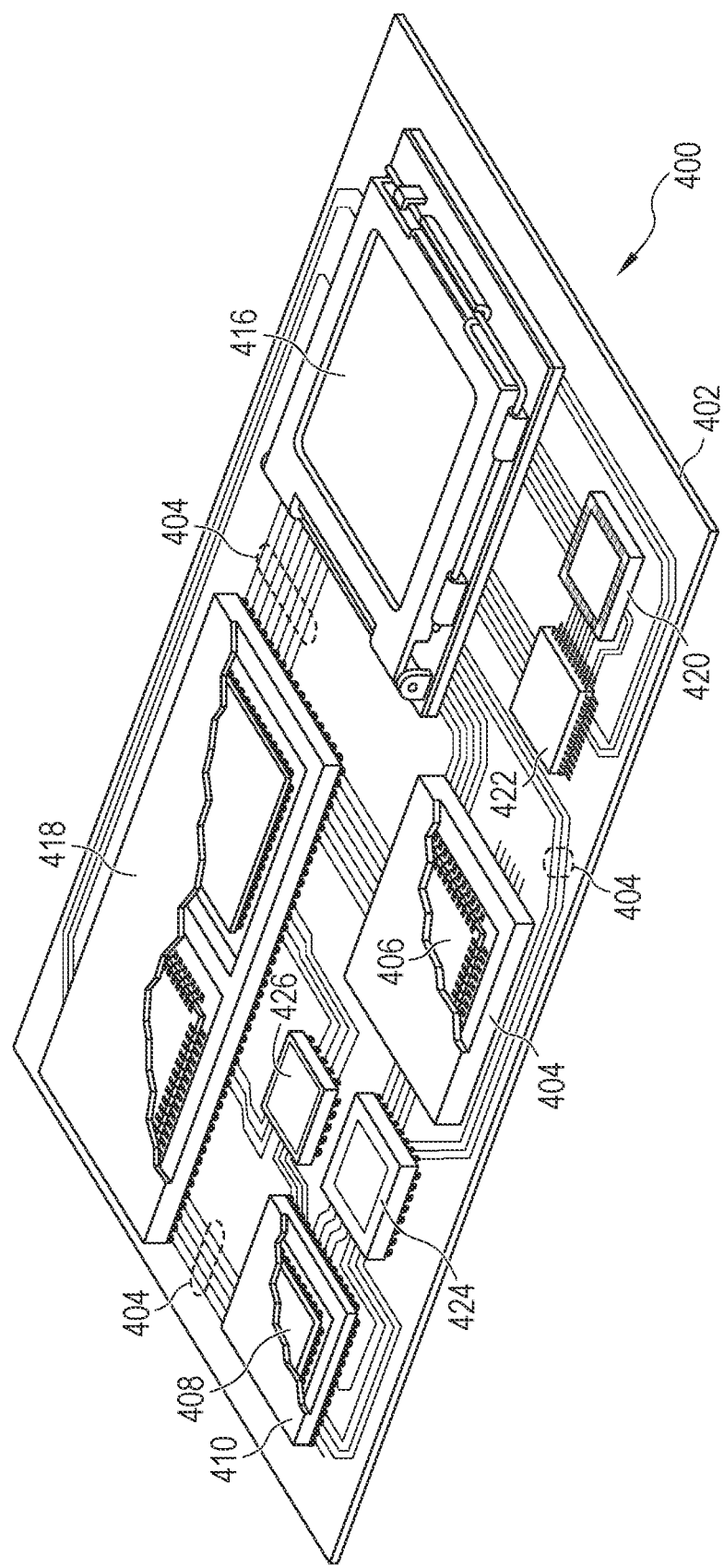
FIG. 9 illustrates a printed circuit board (PCB) with different types of packages disposed on a surface of the PCB.

FIG. 9 illustrates electronic device 400 having a chip carrier substrate or PCB 402 with a plurality of semiconductor packages disposed on a surface of PCB 402, including AoP 220, 230, 260, 270, and 290. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing an antenna substrate;
   disposing a component module over the antenna substrate with the antenna substrate extending beyond the component module, wherein the component module includes,
   (a) an electrical component, and
   (b) a conductive structure formed around the electrical component;
   forming a heat sink over the component module; and
   forming a shielding material over the heat sink.

2. The method of claim 1, wherein the conductive structure includes a plurality of posts or a frame.

3. The method of claim 1, further including depositing an encapsulant around the electrical component and conductive structure.

4. The method of claim 1, further including disposing a thermal interface material over the component module.

5. A method of making a semiconductor device, comprising:
   providing an antenna substrate;
   disposing a component module including an electrical component over the antenna substrate with the antenna substrate extending beyond the component module;
   disposing a conductive structure over the antenna substrate and around the electrical component;
   forming a heat sink over the electrical component and conductive structure; and
   forming a shielding material over the heat sink.

6. The method of claim 5, wherein the conductive structure includes a plurality of posts or a frame.

7. The method of claim 5, further including depositing an encapsulant around the electrical component and conductive structure.

8. The method of claim 5, further including disposing a thermal interface material over the electrical component.

9. The method of claim 5, further including disposing an electrical connector over the antenna substrate.

10. A semiconductor device, comprising:
    an antenna substrate;
    a component module disposed over the antenna substrate with the antenna substrate extending beyond the component module, wherein the component module includes,
    (a) an electrical component, and
    (b) a conductive structure formed around the electrical component;
    a heat sink formed over the component module; and
    a shielding material formed over the heat sink.

11. The semiconductor device of claim 10, wherein the conductive structure includes a plurality of posts or a frame.

12. The semiconductor device of claim 10, further including an encapsulant deposited around the electrical component and conductive structure.

13. The semiconductor device of claim 10, further including a thermal interface material disposed over the component module.

14. A semiconductor device, comprising:
    an antenna substrate;
    an electrical component disposed over the antenna substrate;
    a conductive structure disposed over the antenna substrate and around the electrical component;
    a shielding material formed over the electrical component and conductive structure; and
    a heat sink formed over the electrical component and conductive structure, wherein the heat sink is formed over the electrical component and conductive structure, and the shielding material is formed over the heat sink.

* * * * *